United States Patent
Zhang et al.

(10) Patent No.: US 12,367,825 B2
(45) Date of Patent: Jul. 22, 2025

(54) DISPLAY PANEL AND DISPLAY DEVICE

(71) Applicant: BOE Technology Group Co., Ltd., Beijing (CN)

(72) Inventors: Hao Zhang, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/258,335

(22) PCT Filed: Apr. 7, 2022

(86) PCT No.: PCT/CN2022/085646
§ 371 (c)(1),
(2) Date: Jun. 20, 2023

(87) PCT Pub. No.: WO2023/193207
PCT Pub. Date: Oct. 12, 2023

(65) Prior Publication Data
US 2024/0386847 A1    Nov. 21, 2024

(51) Int. Cl.
*G09G 3/3233* (2016.01)
*H10K 59/131* (2023.01)
(Continued)

(52) U.S. Cl.
CPC ......... *G09G 3/3233* (2013.01); *H10K 59/131* (2023.02); *G09G 3/3258* (2013.01);
(Continued)

(58) Field of Classification Search
CPC ............... G09G 3/3233; G09G 3/3258; G09G 2300/0426; G09G 2300/0819;
(Continued)

(56) References Cited

U.S. PATENT DOCUMENTS 9,013,374 B2   4/2015  Han
9,214,506 B2   12/2015 Xie
(Continued)

FOREIGN PATENT DOCUMENTS

CN      1741114 A    3/2006
CN    102916037 A    2/2013
(Continued)

OTHER PUBLICATIONS

Written Opinion from PCT/CN2022/085646 dated Aug. 3, 2022.
International Search Report from PCT/CN2022/085646 dated Aug. 3, 2022.

*Primary Examiner* — Tom V Sheng
(74) *Attorney, Agent, or Firm* — Calfee, Halter & Griswold LLP

(57) ABSTRACT

A display panel and a display device. The display panel includes a pixel driving circuit, and the pixel driving circuit includes a drive transistor, a first capacitor, a second capacitor, a first transistor, a fifth transistor. A first electrode of the drive transistor is connected to a first power line. A first electrode of the first capacitor is connected to a gate of the drive transistor. A first electrode of the second capacitor is connected to a second electrode of the first capacitor. A first electrode of the first transistor is connected to a data line, and a second electrode is connected to a second electrode of the second capacitor. A first electrode of the fifth transistor is connected to the second electrode of the first capacitor and a second electrode is connected to a stabilized power supply terminal.

19 Claims, 20 Drawing Sheets

(51) Int. Cl.
  *G09G 3/3258* (2016.01)
  *H10D 86/40* (2025.01)
  *H10D 86/60* (2025.01)
(52) U.S. Cl.
  CPC .......... *G09G 2300/0426* (2013.01); *G09G 2300/0819* (2013.01); *G09G 2300/0852* (2013.01); *G09G 2310/08* (2013.01); *G09G 2320/0233* (2013.01); *G09G 2320/043* (2013.01); *H10D 86/481* (2025.01); *H10D 86/60* (2025.01)
(58) Field of Classification Search
  CPC ....... G09G 2300/0852; G09G 2310/08; G09G 2320/0233; G09G 2320/043; G09G 3/32; H10K 59/131; H01L 27/1255; H10D 86/60; H10D 86/481
  USPC .......................................................... 345/690
  See application file for complete search history.

(56) References Cited

U.S. PATENT DOCUMENTS

| | | | |
|---|---|---|---|
| 10,885,843 B1 | 1/2021 | Lu | |
| 2011/0090202 A1* | 4/2011 | Han | G09G 3/3233 345/76 |
| 2012/0068992 A1* | 3/2012 | Toyomura | G09G 3/3208 345/212 |
| 2013/0120337 A1* | 5/2013 | Guo | G09G 3/3208 345/76 |
| 2014/0159609 A1 | 6/2014 | Xie | |
| 2014/0312784 A1* | 10/2014 | Yin | G09G 3/3208 315/172 |
| 2016/0329393 A1 | 11/2016 | Seo | |
| 2017/0047005 A1* | 2/2017 | Jinta | G09G 3/3233 |
| 2019/0259339 A1* | 8/2019 | Yamamoto | H10K 59/123 |
| 2019/0266946 A1* | 8/2019 | Zhu | G09G 3/3233 |
| 2021/0065624 A1* | 3/2021 | Li | G09G 3/3258 |
| 2021/0158754 A1* | 5/2021 | Umezawa | G09G 3/3275 |
| 2022/0319418 A1* | 10/2022 | Yu | G09G 3/3233 |
| 2023/0066613 A1* | 3/2023 | Liu | G09G 3/3266 |
| 2023/0145269 A1* | 5/2023 | Oh | G09G 3/20 345/690 |
| 2023/0206834 A1* | 6/2023 | Liu | G09G 3/3233 345/212 |
| 2023/0247879 A1* | 8/2023 | Cho | H10K 59/1216 257/40 |
| 2024/0054943 A1* | 2/2024 | Kwon | G09G 3/3233 |
| 2024/0304141 A1* | 9/2024 | Huang | G09G 3/3266 |

FOREIGN PATENT DOCUMENTS

| | | |
|---|---|---|
| CN | 102982767 A | 3/2013 |
| CN | 109698226 A | 4/2019 |
| CN | 110335564 A | 10/2019 |
| CN | 209729911 U | 12/2019 |
| CN | 110675822 A | 1/2020 |
| CN | 111243479 A | 6/2020 |
| CN | 111477672 A | 7/2020 |
| CN | 113112954 A | 7/2021 |
| CN | 113674695 A | 11/2021 |
| CN | 114122101 A | 3/2022 |
| WO | 2021143752 A1 | 7/2021 |

* cited by examiner

DISPLAY PANEL AND DISPLAY DEVICE

CROSS-REFERENCE TO RELATED APPLICATIONS

The present application is the U.S. National phase application of International Application No. PCT/CN2022/085646, filed on Apr. 7, 2022, the entire contents of which are hereby incorporated by reference in its entirety.

TECHNICAL FIELD

The present disclosure relates to the field of display technologies, and in particular, to a display panel and display device.

BACKGROUND

In the related art, the display panel generally includes a pixel driving circuit, and the pixel driving circuit needs to compensate the threshold value of the drive transistor in the threshold compensation phase. However, the limited duration of the threshold compensation phase will cause the poor threshold compensation effect of the drive transistor.

It should be noted that the above information disclosed in the "BACKGROUND" section is intended only to enhance the understanding of the background of this disclosure, and therefore it may include information that does not constitute prior art known to those of ordinary skill in the art.

SUMMARY

According to an aspect of the present disclosure, there is provided a display panel, including a pixel driving circuit. The pixel driving circuit includes a drive transistor, a first capacitor, a second capacitor, a first transistor, and a fifth transistor. A first electrode of the drive transistor is connected to a first power line; a first electrode of the first capacitor is connected to a gate of the drive transistor; a first electrode of the second capacitor is connected to a second electrode of the first capacitor; a first electrode of the first transistor is connected to a data line, and a second electrode of the first transistor is connected to a second electrode of the second capacitor; and a first electrode of the fifth transistor is connected to the second electrode of the first capacitor and a second electrode of the fifth transistor is connected to a stabilized power supply terminal.

In an exemplary embodiment of the present disclosure, the display panel further includes a substrate, a first conductive layer, a second conductive layer, and a third conductive layer. The first conductive layer is disposed on one side of the substrate, and includes a first conductive portion configured to form the gate of the drive transistor and the first electrode of the first capacitor. The second conductive layer is disposed on one side of the first conductive layer away from the substrate, and includes a second conductive portion, where an orthographic projection of the second conductive portion on the substrate at least partially overlaps with an orthographic projection of the first conductive portion on the substrate; and the second conductive portion is configured to form the second electrode of the first capacitor and the first electrode of the second capacitor. The third conductive layer is disposed on one side of the second conductive layer away from the substrate, and includes a third conductive portion, where an orthographic projection of the third conductive portion on the substrate at least partially overlaps with the orthographic projection of the second conductive portion on the substrate, and the orthographic projection of the third conductive portion on the substrate at least partially overlaps with the orthographic projection of the first conductive portion on the substrate; and the third conductive portion is configured to form the second electrode of the second capacitor.

In an exemplary embodiment of the present disclosure, the orthographic projection of the second conductive portion on the substrate covers an overlapping area of the orthographic projection of the first conductive portion on the substrate and the orthographic projection of the third conductive portion on the substrate.

In an exemplary embodiment of the present disclosure, the display panel further includes a fourth conductive layer and a fifth conductive layer. The fourth conductive layer is disposed on one side of the third conductive layer away from the substrate. The fifth conductive layer is disposed on one side of the fourth conductive layer away from the substrate, and includes the data line, an orthographic projection of the data line on the substrate extending along a second direction.

In an exemplary embodiment of the present disclosure, an overlapping area of the orthographic projection of the data line on the substrate and the orthographic projection of the third conductive portion on the substrate is 0.

In an exemplary embodiment of the present disclosure, the display panel includes a plurality of pixel driving circuits distributed in a first direction, where the orthographic projections of the third conductive portions of adjacent pixel driving circuits on the substrate are adjacent and spaced apart along the first direction, the first direction intersecting with the second direction; and at least part of the orthographic projection of the data line on the substrate is between the orthographic projections of the adjacent third conductive portions on the substrate.

In an exemplary embodiment of the present disclosure, the display panel further includes an active layer between the substrate and the first conductive layer. The active layer includes a ninth active portion connected to the first electrode of the first transistor, the data line being connected to the ninth active portion through at least one via hole. The first conductive layer further includes a reset signal line. An orthographic projection of the reset signal line on the substrate extends along the first direction, and the reset signal line is connected to the gate of the first transistor. In the first direction, an orthographic projection of the at least one via hole on the substrate is between the orthographic projections of the adjacent third conductive portions on the substrate, and at least part of the orthographic projection of the at least one via hole on the substrate is on one side, away from the orthographic projection of the third conductive portion on the substrate, of the orthographic projection of the reset signal line on the substrate.

In an exemplary embodiment of the present disclosure, the fourth conductive layer further includes a plurality of first power lines, orthographic projections of the plurality of first power lines on the substrate extending along the second direction and being spaced part along a first direction, the first direction intersecting with the second direction; the third conductive layer further includes a plurality of second power lines, orthographic projections of the plurality of second power lines on the substrate extending along the first direction and being spaced along the second direction; and at least part of a first power line of the plurality of first power lines is connected to at least part of a second power line of the plurality of second power lines through a via hole.

In an exemplary embodiment of the present disclosure, the fifth conductive layer further includes: a plurality of third power lines, orthographic projections of the plurality of third power lines on the substrate extending along the second direction and being spaced apart along the first direction; where an orthographic projection of a third power line of the plurality of third power lines on the substrate at least partially overlaps with an orthographic projection of the first power line on the substrate, and the third power line is connected to the first power line through a via hole.

In an exemplary embodiment of the present disclosure, the display panel includes a plurality of pixel driving circuits distributed in a first direction, where the fourth conductive layer includes a plurality of first power lines corresponding to the plurality of pixel driving circuits, and one first power line of the plurality of first power lines is connected to the drive transistor in a corresponding pixel driving circuit of the plurality of pixel driving circuits, the first direction intersecting with the second direction; orthographic projections of the plurality of first power lines on the substrate extend along the second direction and are spaced apart along the first direction; the third conductive portion includes a first edge facing the data line, and an orthographic projection of the first edge on the substrate extends along the second direction, the data line including a first extension provided opposite to the first edge in the first direction; and an orthographic projection on the substrate of one first power line of the plurality of first power lines covers an orthographic projection of the first extension on the substrate, and covers the orthographic projection of the first edge on the substrate.

In an exemplary embodiment of the present disclosure, the orthographic projection of the third conductive portion on the substrate is between an orthographic projection of the date line on the substrate and the orthographic projection of the first power line on the substrate. The first power line includes a second extension and a first protrusion, an orthographic projection of the second extension on the substrate extending along the second direction, the first protrusion being connected to the second extension, an orthographic projection of the first protrusion on the substrate being on a side, away from the orthographic projection of the date line on the substrate, of the orthographic projection of the second extension on the substrate. The plurality of pixel driving circuits include a first pixel driving circuit and a second pixel driving circuit distributed adjacent to each other in the first direction; the orthographic projection on the substrate of the first power line of the first pixel driving circuit is on a side, away from the orthographic projection of the first power line of the second pixel driving circuit on the substrate, of the orthographic projection of the date line of the second pixel driving circuit on the substrate; and the orthographic projection on the substrate of the first protrusion on the first power line in the first pixel driving circuit, covers the orthographic projection on the substrate of the first extension on the data line in the second pixel driving circuit, and covers the orthographic projection on the substrate of the first edge of the third conductive portion in the second pixel driving circuit.

In an exemplary embodiment of the present disclosure, the display panel includes a plurality of pixel driving circuits distributed in an array along a first direction and a second direction, the first direction being a row direction and the second direction being a column direction. The pixel driving circuit further includes a second transistor, a first electrode of the second transistor being connected to the gate of the drive transistor, a second electrode of the second transistor being connected to the second electrode of the drive transistor. The display panel further includes a substrate and a first conductive layer, where the first conductive layer is disposed on one side of the substrate, and includes a gate drive signal line, an orthographic projection of the gate drive signal line on the substrate extending along the first direction, the gate drive signal line being connected to a gate of the second transistor in a current row of the pixel driving circuits, and a gate of the fifth transistor in a next row of pixel driving circuits.

In an exemplary embodiment of the present disclosure, the display panel further includes a light emitting unit, where the pixel driving circuit is configured to drive the light emitting unit to emit light, and further includes a sixth transistor, a first electrode of the sixth transistor being connected to a first initial signal line, a second electrode of the sixth transistor being connected to a first electrode of the light emitting unit; and the gate drive signal line is connected to a gate of the sixth transistor in the current row of pixel driving circuits and the gate of the fifth transistor in the next row of pixel driving circuits.

In an exemplary embodiment of the present disclosure, the pixel driving circuit further includes a fourth transistor, a first electrode of the fourth transistor being connected to a first initial signal line and a second electrode of the fourth transistor being connected to the gate of the drive transistor. The display panel further includes a substrate and a first conductive layer, where the first conductive layer is disposed on one side of the substrate, and includes a reset signal line, an orthographic projection of the reset signal line on the substrate extending along a first direction, the reset signal line being connected to a gate of the first transistor and a gate of the fourth transistor.

In an exemplary embodiment of the present disclosure, the display panel further includes a second conductive layer and a fifth conductive layer. The second conductive layer is disposed on one side of the first conductive layer away from the substrate, and includes a plurality of first initial signal lines, orthographic projections of the plurality of first initial signal lines on the substrate extending along the first direction and being spaced apart along a second direction, the first direction intersecting with the second direction. The fifth conductive layer is disposed on one side of the second conductive layer away from the substrate, and includes a plurality of second initial signal lines, orthographic projections of the plurality of second initial signal lines on the substrate extending along the first direction and being spaced apart along the second direction. At least part of a first initial signal line of the plurality of first initial signal lines is connected to at least part of a second initial signal line of the plurality of second initial signal lines through a via hole.

In an exemplary embodiment of the present disclosure, the display panel further includes an active layer between the substrate and the first conductive layer. The active layer includes a tenth active portion, an eleventh active portion and a twelfth active portion. The tenth active portion is configured to form a first channel region of the fifth transistor. The eleventh active portion is configured to form a second channel region of the fifth transistor. The twelfth active portion is connected between the tenth active portion and the eleventh active portion. The orthographic projection of the second conductive portion on the substrate at least partially overlaps with an orthographic projection of the twelfth active portion on the substrate.

In an exemplary embodiment of the present disclosure, the pixel driving circuit further includes a fourth transistor, a first electrode of the fourth transistor being connected to a first initial signal line, a second electrode of the fourth transistor being connected to the gate of the drive transistor. The display panel further includes an active layer between the substrate and the first conductive layer. The active layer includes a thirteenth active portion, a fourteenth active portion, and a fifteenth active portion. The thirteenth active portion is configured to form a first channel region of the fourth transistor. The fourteenth active portion is configured to form a second channel region of the fourth transistor. The fifteenth active portion is connected between the thirteenth active portion and the fourteenth active portion. The orthographic projection of the second conductive portion on the substrate at least partially overlaps with an orthographic projection of the fifteenth active portion on the substrate.

In an exemplary embodiment of the present disclosure, the display panel includes a plurality of pixel driving circuits, the plurality of pixel driving circuits including a first pixel driving circuit and a second pixel driving circuit distributed adjacent to each other in a first direction. The the first power line in the first pixel driving circuit is connected to the second electrode of the fifth transistor in the second pixel driving circuit.

In an exemplary embodiment of the present disclosure, the display panel includes a light emitting unit, where the pixel driving circuit is configured to drive the light emitting unit to emit light. The pixel driving circuit further includes a seventh transistor and an eighth transistor, a first electrode of the seventh transistor being connected to the first power line, a second electrode of the seventh transistor being connected to the second electrode of the first transistor, a first electrode of the eighth transistor being connected to a second electrode of the drive transistor, a second electrode of the eighth transistor being connected to a first electrode of the light emitting unit. The display panel further includes a substrate and a first conductive layer. The first conductive layer is disposed on one side of the substrate, and includes an enable signal line, an orthographic projection of the enable signal line on the substrate extending along a first direction, the enable signal line being connected to a gate of the seventh transistor and a gate of the eighth transistor.

In an exemplary embodiment of the present disclosure, the display panel further includes a light emitting unit, where the pixel driving circuit is configured to drive the light emitting unit to emit light. The pixel driving circuit further includes a seventh transistor and an eighth transistor, a first electrode of the seventh transistor being connected to a first initial signal line, a second electrode of the seventh transistor being connected to the second electrode of the first transistor, a first electrode of the eighth transistor being connected to a second electrode of the drive transistor, a second electrode of the eighth transistor being connected to a first electrode of the light emitting unit. The display panel further includes a substrate and a first conductive layer. The first conductive layer is disposed on one side of the substrate, and includes an enable signal line, an orthographic projection of the enable signal line on the substrate extending along a first direction, the enable signal line being connected to a gate of the seventh transistor and a gate of the eighth transistor.

According to an aspect of the present disclosure, there is provided a display device, including the display panel as described above.

It should be understood that the above general description and the following detailed descriptions are exemplary and explanatory only and do not limit the present disclosure.

BRIEF DESCRIPTION OF THE DRAWINGS

The accompanying drawings herein are incorporated into and form part of the specification, show embodiments at that are consistent with the present disclosure, and are used in conjunction with the specification to explain the principles of the present disclosure. It will be apparent that the accompanying drawings in the following description are only some of embodiments of the present disclosure, and that other drawings may be obtained from them without creative effort by those of ordinary skill in the art.

DETAILED DESCRIPTION

Figure 1:
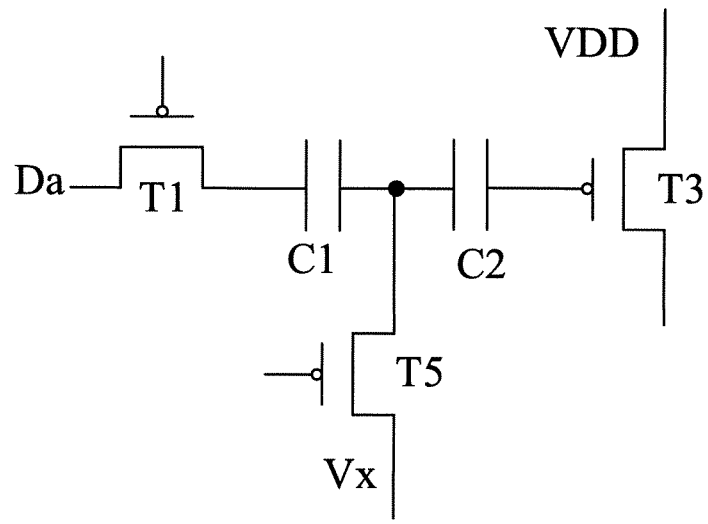
FIG. 1 is a schematic diagram of a structure of a pixel driving circuit in a display panel according to an exemplary embodiment of the present disclosure.

Exemplary embodiments will now be described more fully with reference to the accompanying drawings. However, the exemplary embodiments can be implemented in a variety of forms and should not be construed as being limited to the embodiments set forth herein; rather, the provision of these embodiments makes the present disclosure comprehensive and complete and conveys the ideas of the exemplary embodiments to those skilled in the art in a comprehensive manner. The same reference numerals in the drawings indicate the same or similar structures, and thus their detailed description will be omitted.

The terms "one", "a/an", and "the/said" are used to indicate the existence of one or more elements/components/etc. The terms "including/comprising" and "having" are used to indicate open-ended inclusion and to mean that additional elements/components/etc. may exist in addition to the listed elements/components/etc.

An exemplary embodiment provides a display panel including a pixel driving circuit, as shown in FIG. 1. FIG. 1 is a schematic diagram of a structure of the pixel driving circuit of the display panel according to the exemplary embodiment of the present disclosure. The pixel driving circuit includes: a drive transistor T3, a first capacitor C1, a second capacitor C2, a first transistor T1 and a fifth transistor T5. A first electrode of the drive transistor T3 is connected to a first power supply terminal VDD. A first electrode of the first capacitor C1 is connected to a gate of the drive transistor T3. A first electrode of the second capacitor C2 is connected to a second electrode of the first capacitor C1. A first electrode of the first transistor T1 is connected to a data signal terminal Da, and a second electrode of the first transistor T1 is connected to a second electrode of the second capacitor C2. A first electrode of the fifth transistor T5 is connected to the second electrode of the first capacitor C1, and a second electrode of the fifth transistor T5 is connected to a stabilized power supply terminal Vx.

In this exemplary embodiment, when the fifth transistor T5 is turned on, the stabilized power supply terminal Vx writes a stable voltage into the second electrode of the first capacitor C1 and the first electrode of the second capacitor C2, and the first electrode of the first capacitor and the second electrode of the second capacitor are not coupled with each other under the shielding effect of the second electrode of the first capacitor C1 and the first electrode of the second capacitor C2; and when the fifth transistor T5 is turned off, the second electrode of the first capacitor C1 and the first electrode of the second capacitor C2 are in a suspended state, and the first electrode of the first capacitor and the second electrode of the second capacitor C2 can be coupled to each other. When the fifth transistor is turned on, the pixel driving circuit can write a threshold compensation voltage into the gate of the drive transistor T3 and a data signal into the second electrode of the first transistor T1 respectively at different time periods. When the fifth transistor is turned off, the pixel driving circuit can couple the data signal from the second electrode of the first transistor T1 to the gate of the drive transistor T3. Thus, the pixel driving circuit can achieve a better threshold compensation effect by setting the duration of the threshold compensation phase arbitrarily while the data writing duration remains unchanged, i.e., while the refresh frequency of the display panel is guaranteed to remain unchanged.

In this exemplary embodiment, the first transistor T1, the drive transistor T3, and the fifth transistor T5 may all be P-type transistors as shown in FIG. 1. It should be understood that in other exemplary embodiments, the above transistors may also be N-type transistors. The stabilized power supply terminal Vx may be a signal terminal equipotential to a first power line, and in addition, the stabilized power supply terminal Vx may be other stabilized power supply terminal with constant voltage, for example, the stabilized power supply terminal Vx may be a signal terminal equipotential to an initial signal line.

It should be noted that the transistors in all embodiments of the present disclosure may be thin film transistors or field effect transistors or other devices with the same characteristics. In all embodiments of the disclosure, the first electrode may be a drain and the second electrode may be a source, or the first electrode may be a source and the second electrode may be a drain. In this exemplary embodiment, "connected to" may include a physical connection and an electrical connection.

Figure 2:
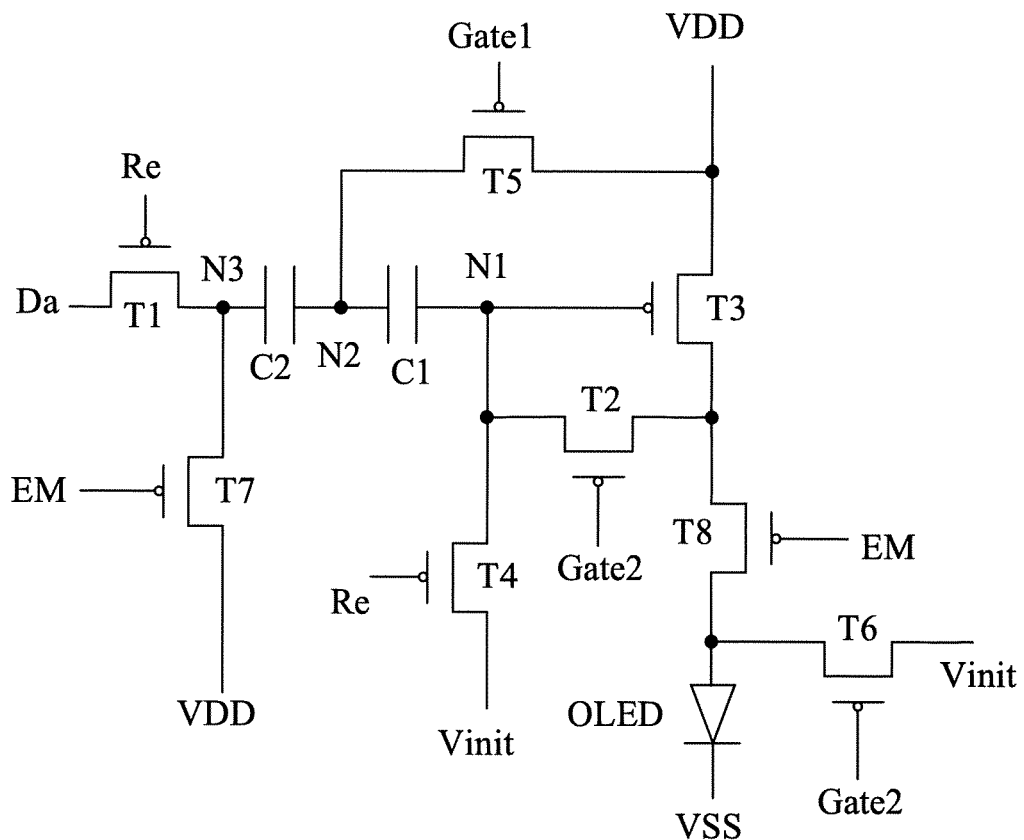
FIG. 2 is a schematic diagram of a structure of a pixel driving circuit in the display panel according to another exemplary embodiment of the present disclosure.

FIG. 2 is a schematic diagram of a structure of a pixel driving circuit in the display panel according to another exemplary embodiment of the present disclosure. As shown in FIG. 2, the pixel driving circuit is used to drive the light emitting unit OLED. The pixel driving circuit may include a first transistor T1, a second transistor T2, a drive transistor T3, a fourth transistor T4, a fifth transistor T5, a sixth transistor T6, a seventh transistor T7, an eighth transistor T8, a first capacitor C1, and a second capacitor C2. A first electrode of the drive transistor T3 is connected to the first power supply terminal VDD, and a gate of the drive transistor T3 is connected to a first node N1. The first capacitor C1 is connected between the first node N1 and a second node N2. The second capacitor C2 is connected between the second node N2 and a third node N3. A first electrode of the first transistor is connected to a data signal terminal Da, a second electrode of the first transistor is connected to the third node N3, and a gate of the first transistor is connected to a reset signal terminal Re. A first electrode of the second transistor T2 is connected to the first node N1, a second electrode of the second transistor T2 is connected to a second electrode of the drive transistor T3, and a gate of the second transistor T2 is connected to a second gate drive signal terminal Gate2. A first electrode of the fourth transistor T4 is connected to an initial signal terminal Vinit, a second electrode of the fourth transistor T4 is connected to the first node N1, and a gate of the fourth transistor T4 is connected to a reset signal terminal Re. A first electrode of the fifth transistor T5 is connected to the second node N2, a second electrode of the fifth transistor T5 is connected to a first power supply terminal VDD, and a gate of the fifth transistor T5 is connected to a first gate drive signal terminal Gate1. A first electrode of the sixth transistor T6 is connected to an initial signal terminal Vinit, a second electrode of the sixth transistor T6 is connected to a first electrode of the light emitting unit OLED, and a gate of the sixth transistor T6 is connected to a second gate drive signal terminal Gate2. A first electrode of the seventh transistor is connected to a first power supply terminal VDD, a second electrode of the seventh transistor is connected to the third node N3, and a gate of the seventh transistor is connected to an enable signal terminal EM. A first electrode of the eighth transistor T8 is connected to the second electrode of the drive transistor T3, a second electrode of the eighth transistor T8 is connected to the first electrode of the light emitting unit OLED, and a gate of the eighth transistor T8 is connected to an enable signal terminal EM. A second electrode of the light emitting unit OLED is connected to a second power supply terminal VSS. The above transistors may be P-type transistors, and the voltage at the first power supply terminal VDD may be greater than the voltage at the second power supply terminal VSS. In this exemplary embodiment, the first power supply terminal VDD may form the stabilized power supply terminal as described above. It should be understood that in other exemplary embodiments, the second electrode of the fifth transistor T5 can be connected to other stabilized power supply terminal.

Figure 3:
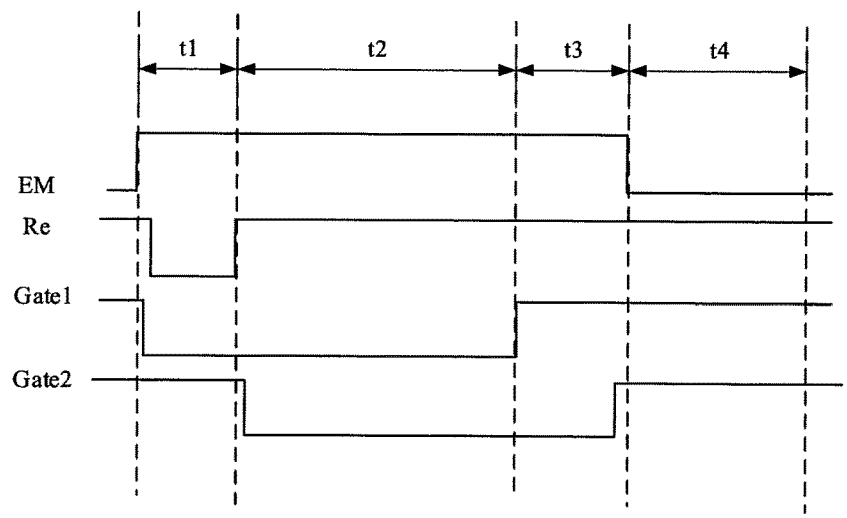
FIG. 3 is a timing diagram of each point in a driving method for the pixel driving circuit shown in FIG. 2.

FIG. 3 is a timing diagram of each point in a driving method for the pixel driving circuit shown in FIG. 2, in which, EM denotes the timing diagram of the enable signal terminal, Re denotes the timing diagram of the reset signal terminal, Gate1 denotes the timing diagram of the first gate drive signal terminal; and Gate2 denotes the timing diagram of the second gate drive signal terminal. The driving method for the pixel driving circuit may include four phases, i.e., a data writing phase t1, a threshold compensation phase t2, a buffer phase t3, and a light-emitting phase t4. In the data writing phase t1, the reset signal terminal Re and the first gate driving signal terminal Gate1 output low-level signals, the enable signal terminal EM and the second gate driving signal terminal Gate2 output high-level signals, the first transistor T1, fourth transistor T4 and fifth transistor T5 are turned on, the data signal terminal Da writes a data signal into the third node N3, the first power supply terminal VDD writes a supply voltage into the second node N2, and the initial signal terminal Vinit writes an initial signal to the first node N1. In the threshold compensation phase t2, the first gate drive signal terminal Gate1 and the second gate drive signal terminal Gate2 output low-level signals, the enable signal terminal EM and the reset signal terminal Re output high-level signals, the fifth transistor T5, the second transistor T2 and the sixth transistor T6 are turned on, and the first power supply terminal VDD writes a voltage Vdd+Vth into the first node N1 through the drive transistor T3, where Vdd is the voltage of the first power supply terminal VDD and Vth is the threshold voltage of the drive transistor T3, while the voltage of the third node N3 remains unchanged; in addition, the initial signal terminal Vinit writes an initial signal into the first electrode of the light emitting unit through the sixth transistor T6. In the buffer phase t3, the second gate drive signal terminal Gate2 outputs a low-level signal, the first gate drive signal terminal Gate1, the enable signal terminal EM, and the reset signal terminal Re output high-level signals, the fifth transistor T5 is turned off, and the second node is in a suspended state. In the light-emitting phase t4, the enable signal terminal EM outputs a low-level signal, the first gate drive signal terminal Gate1, the second gate drive signal terminal Gate2, and the reset signal terminal Re output high-level signals, the seventh transistor T7 is turned on, the eighth transistor T8 is turned on, the voltage of the third node N3 changes from Vdata to Vdd, Vdata being the voltage of the data signal, and the voltage of the second node N2 changes to Vdd+Vdd−Vdata under the coupling effect of the second capacitor C2, and the voltage of the first node N1 changes to Vdd+Vth+Vdd−Vdata under the coupling effect of the first capacitor C1. According to the output current formula $I=(\mu W C_{ox}/2L)(V_{gs}-V_{th})^2$ of the drive transistor in the pixel driving circuit, where $\mu$ denotes the carrier mobility, $C_{ox}$ denotes the gate capacitance per unit area, W denotes the width of the drive transistor channel, L denotes the length of the drive transistor channel, Vgs denotes the voltage difference of the gate and source of the drive transistor, and Vth denotes the threshold voltage of the drive transistor, the output current of the drive transistor in the pixel driving circuit of the this disclosure is that $I=(\mu W C_{ox}/2L)(Vdd+Vth+Vdd-Vdata-Vdd-Vth)^2 = (\mu W C_{ox}/2L)(Vdd-Vdata)^2$. Therefore, this pixel driving circuit can avoid the effect of the drive transistor threshold on its output current.

It should be understood that in other exemplary embodiments, at least some of the first transistor T1, the second transistor T2, the fourth transistor T4, the fifth transistor T5, the sixth transistor T6, the seventh transistor T7, and the eighth transistor T8 may be N-type transistors which have a smaller turn-off leakage current, so that the leakage problem of each node in the pixel driving circuit can be improved. For example, in other exemplary embodiments, the second transistor T2 and the fourth transistor T4 may be N-type transistors, which can reduce the leakage current of the first node N1 that flows through the second transistor T2 and the fourth transistor T4 during the light-emitting phase. For another example, the first transistor T1 and the seventh transistor T7 may be N-type transistors, which can reduce the leakage current of the third node that flows through the first transistor T1 and the seventh transistor T7 during the threshold compensation phase t2, and buffer phase t3. For yet another example, the eighth transistor T8 may be an N-type transistor, which can reduce the leakage current of the first node N1 that flows through the second transistor T2 and the eighth transistor T8 in turn during the light-emitting phase. For yet another example, the fifth transistor T5 and the sixth transistor T6 may be N-type transistors, which can reduce the leakage current of the first power supply terminal VDD that flows through the fifth transistor T5 during the light-emitting phase and the leakage current of the second electrode of the drive transistor that flows through the sixth transistor T6 during the light-emitting phase.

Figure 4:
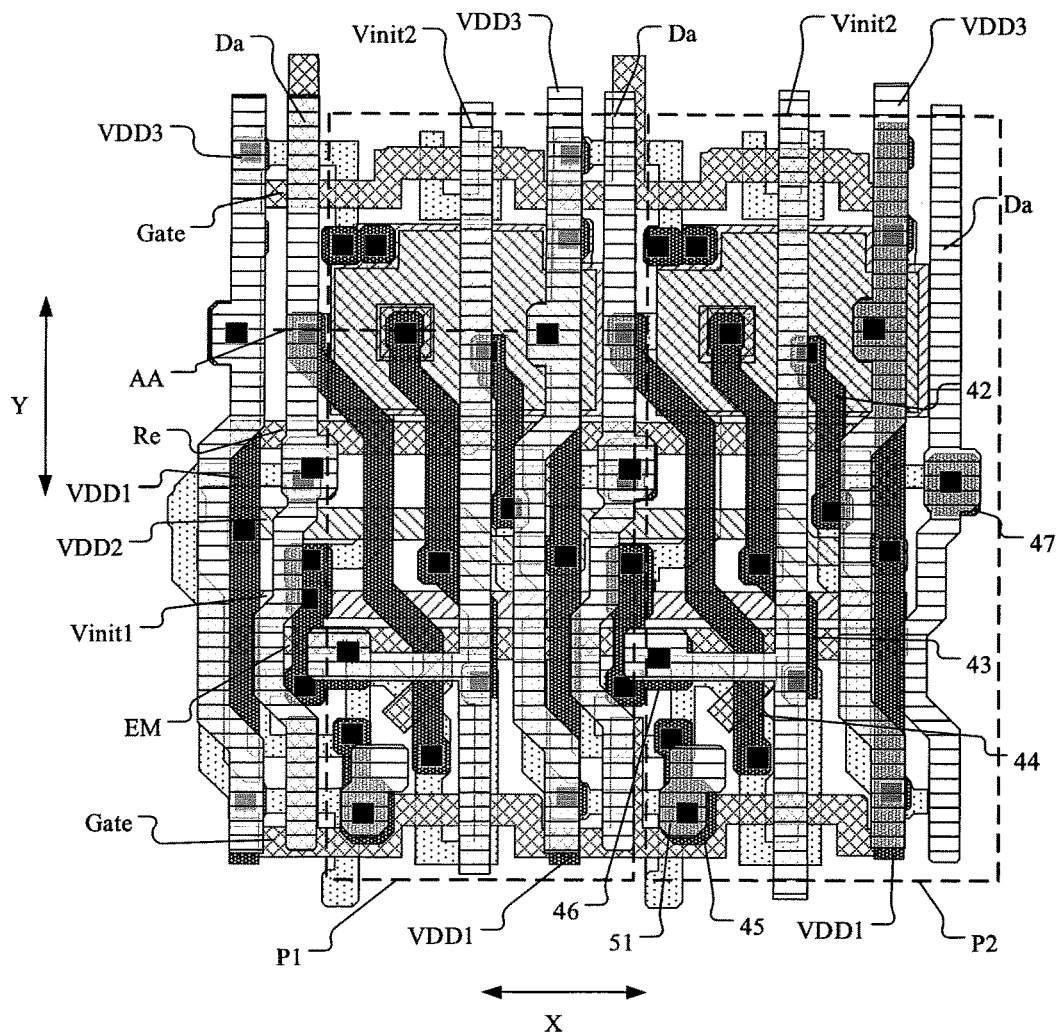
FIG. 4 is a structural layout of a display panel according to an exemplary embodiment of the present disclosure.
Figure 5:
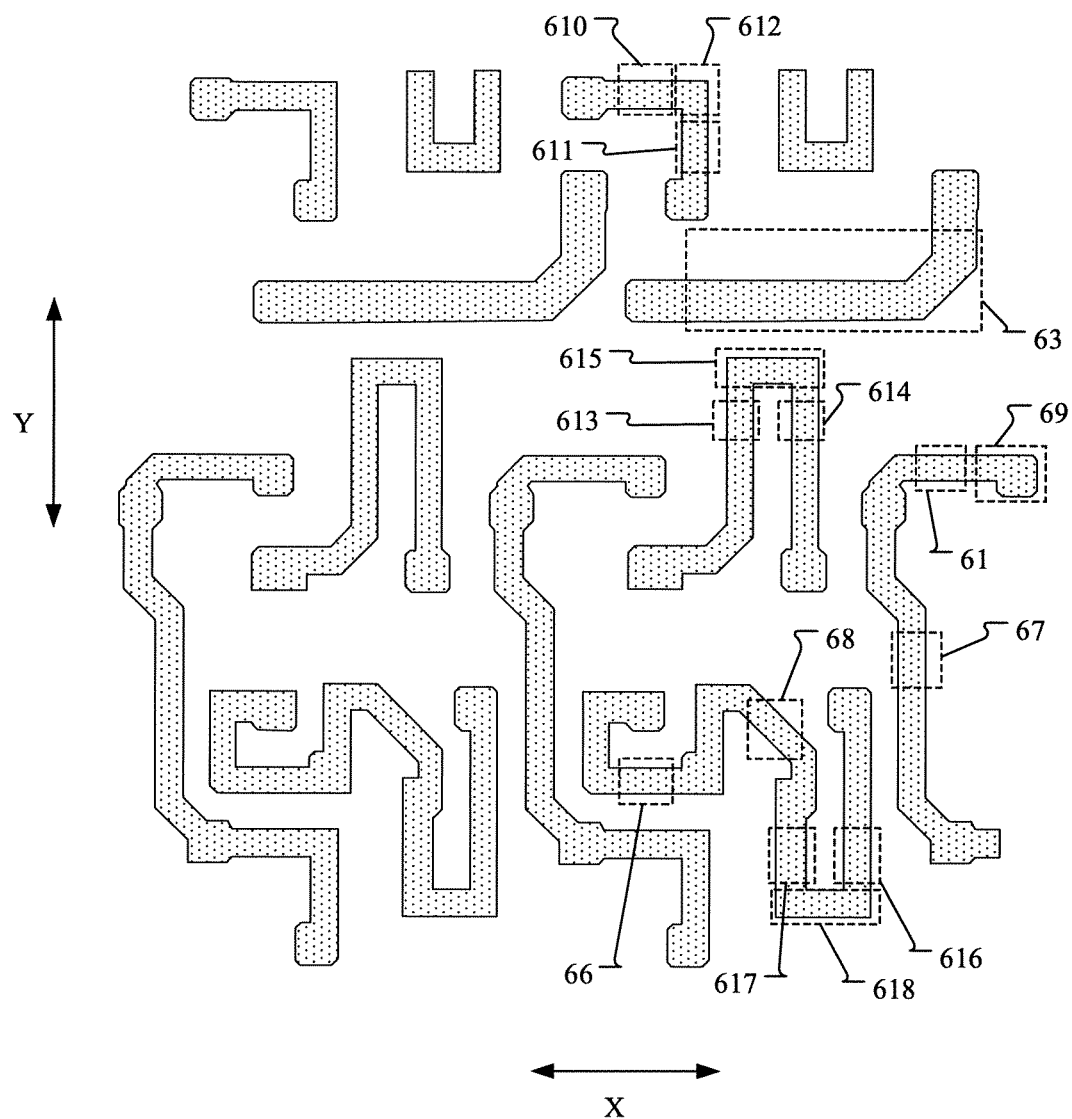
FIG. 5 is a structural layout of an active layer in FIG. 4.
Figure 6:
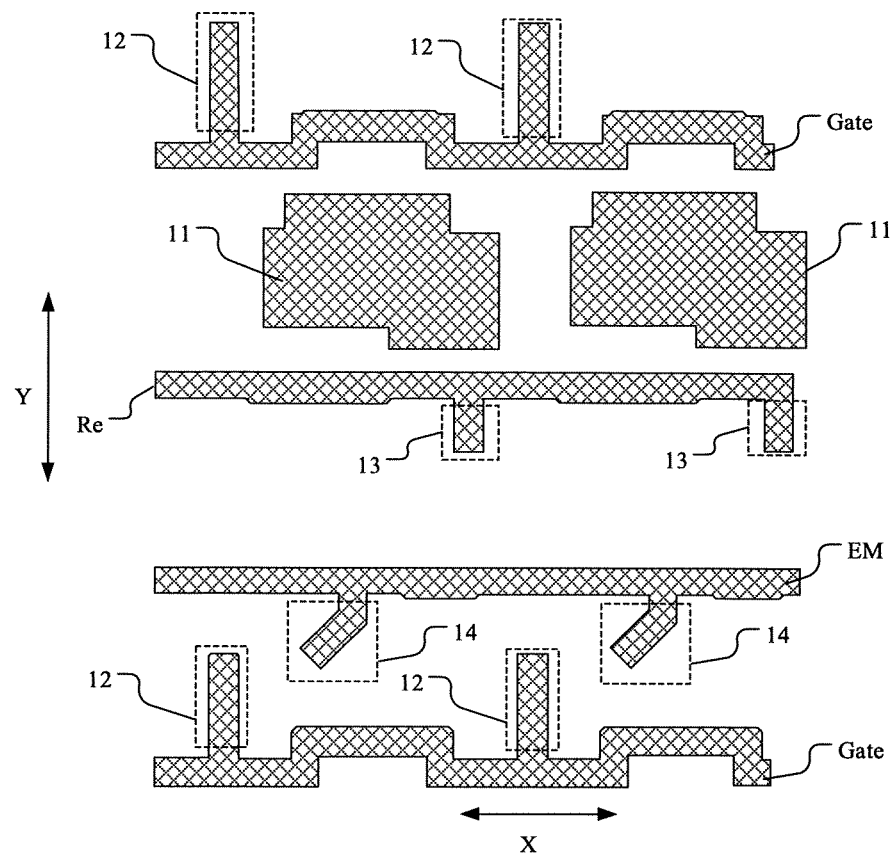
FIG. 6 is a structural layout of a first conductive layer in FIG. 4.
Figure 7:
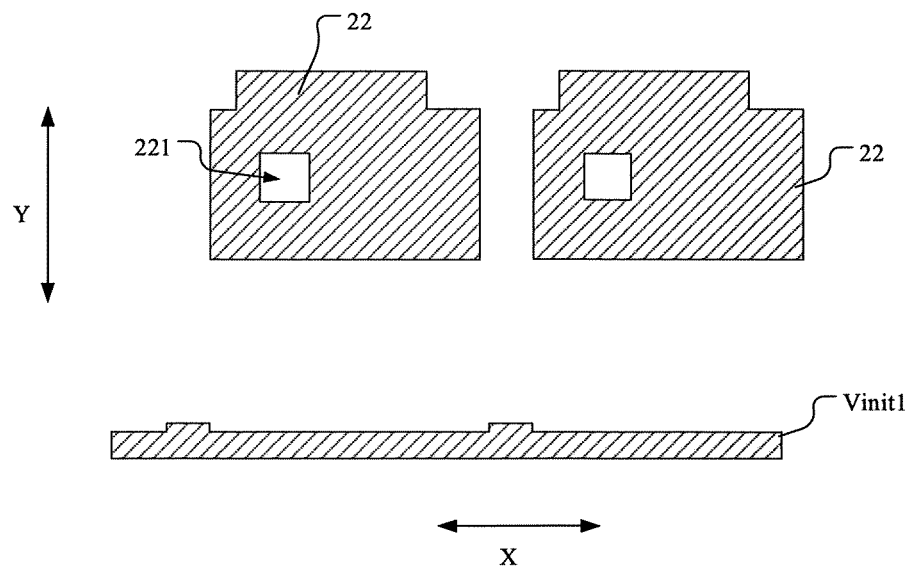
FIG. 7 is a structural layout of a second conductive layer in FIG. 4.
Figure 8:
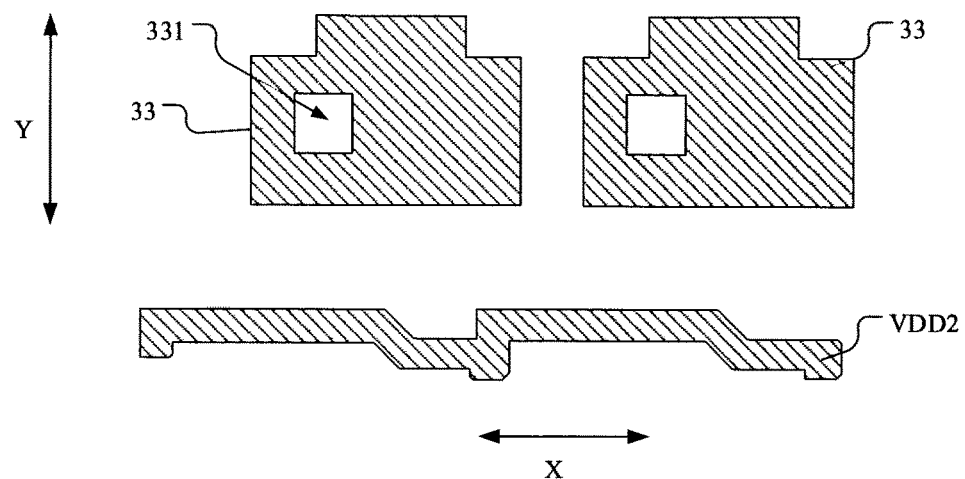
FIG. 8 is a structural layout of a third conductive layer in FIG. 4.
Figure 9:
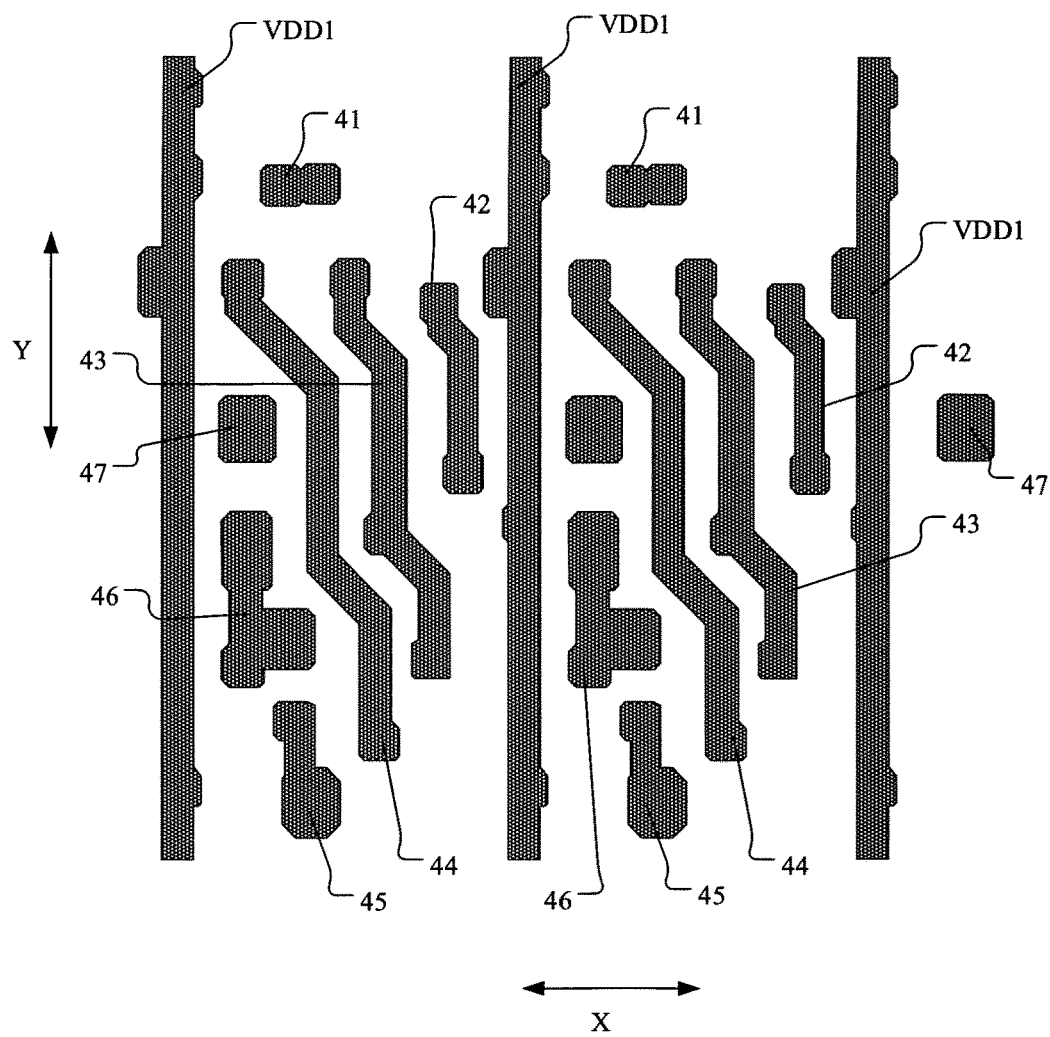
FIG. 9 is a structural layout of a fourth conductive layer in FIG. 4.
Figure 10:
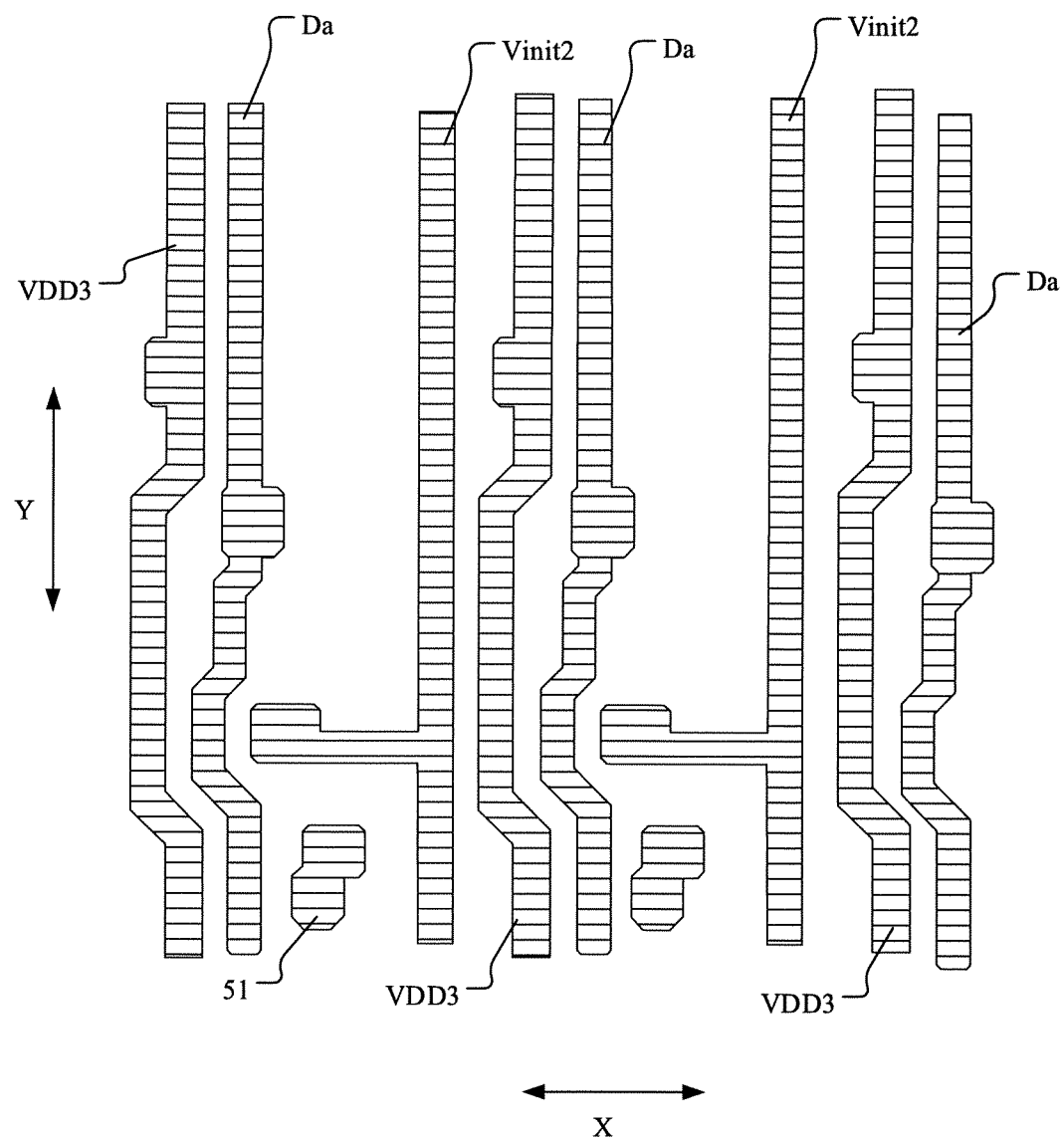
FIG. 10 is a structural layout of a fifth conductive layer in FIG. 4.
Figure 11:
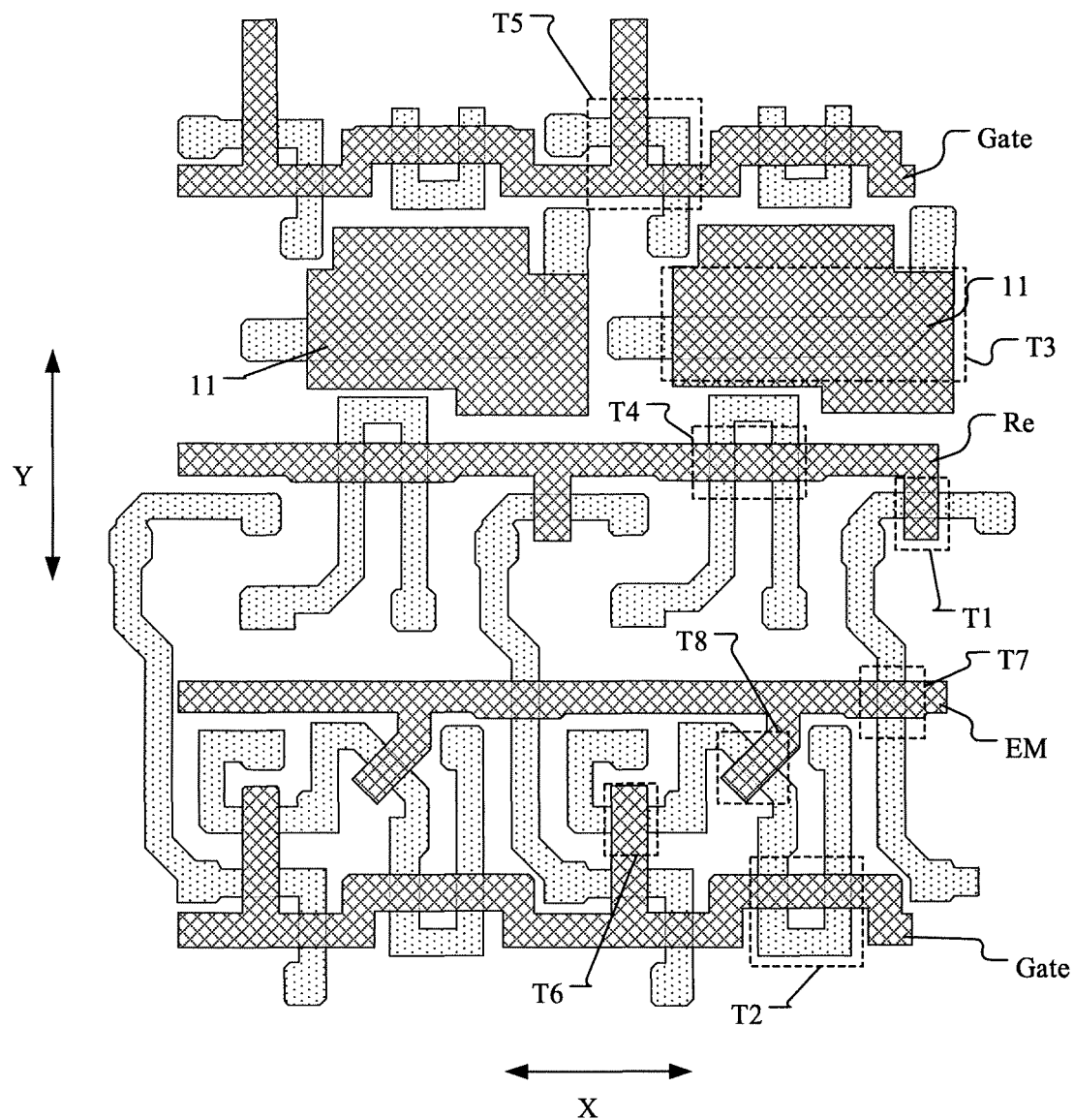
FIG. 11 is a structural layout of the active layer and the first conductive layer in FIG. 4.
Figure 12:
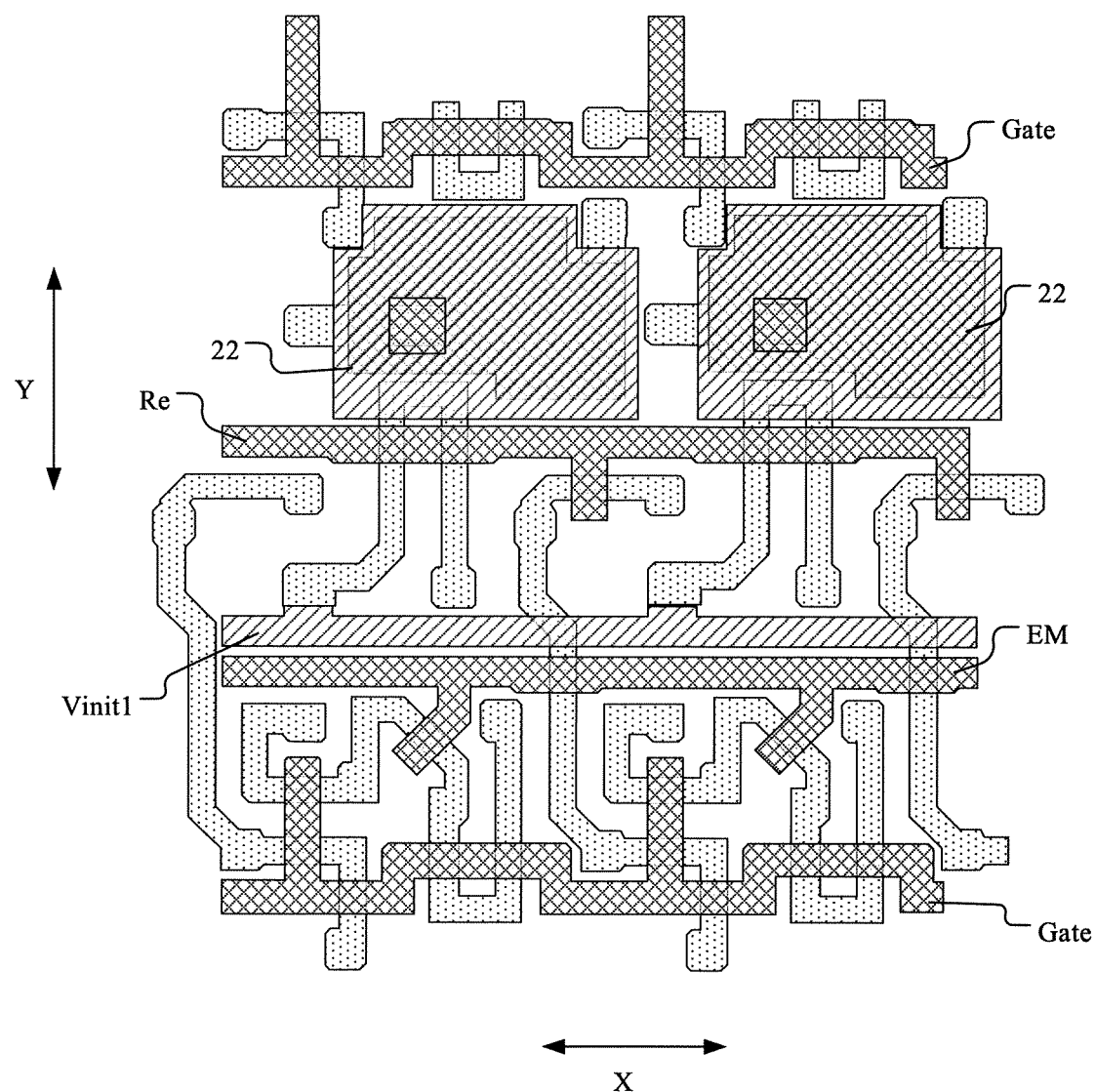
FIG. 12 is a structural layout of the active layer, the first conductive layer, and the second conductive layer in FIG. 4.
Figure 13:
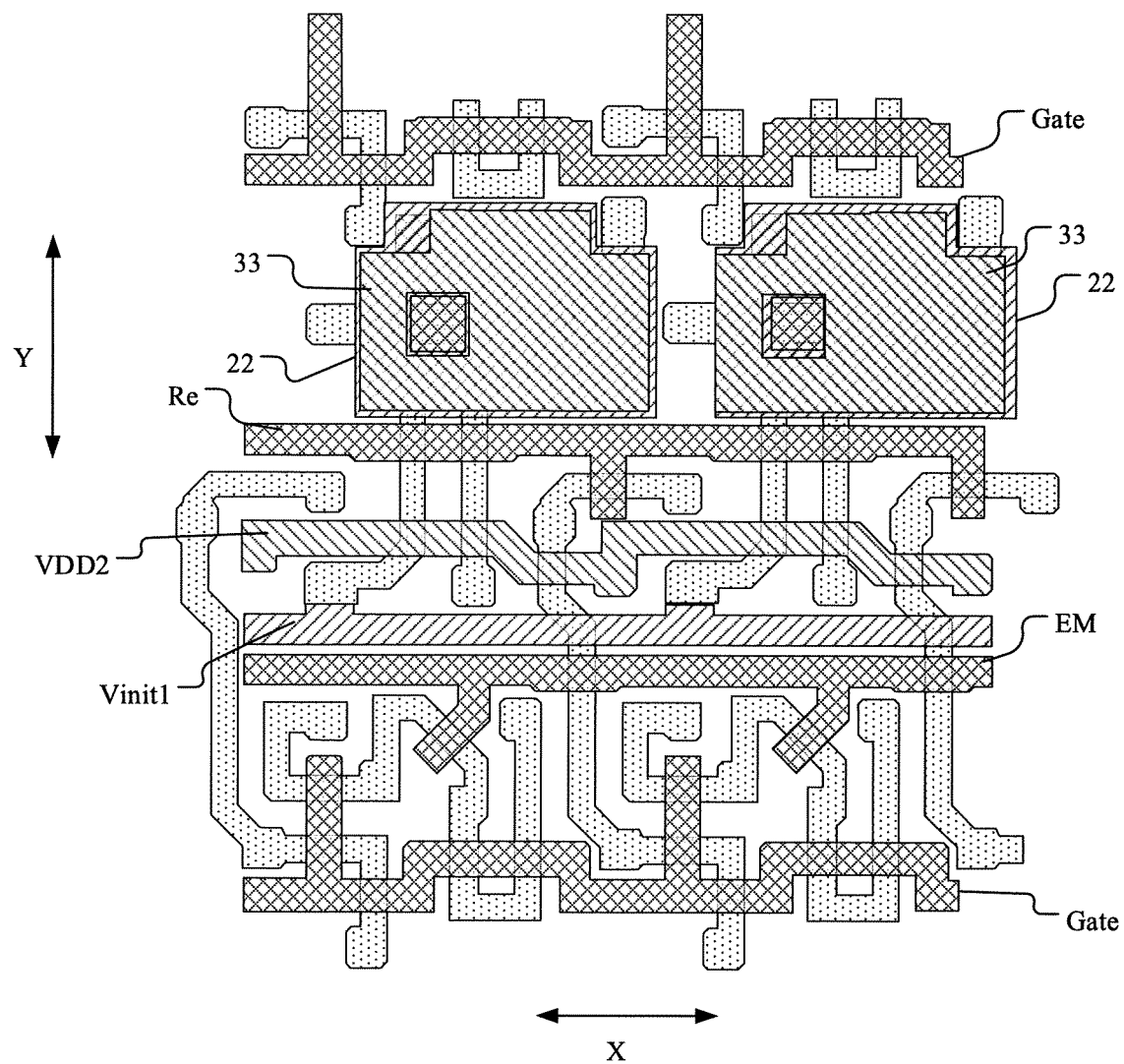
FIG. 13 is a structural layout of the active layer, the first conductive layer, the second conductive layer, and the third conductive layer in FIG. 4.
Figure 14:
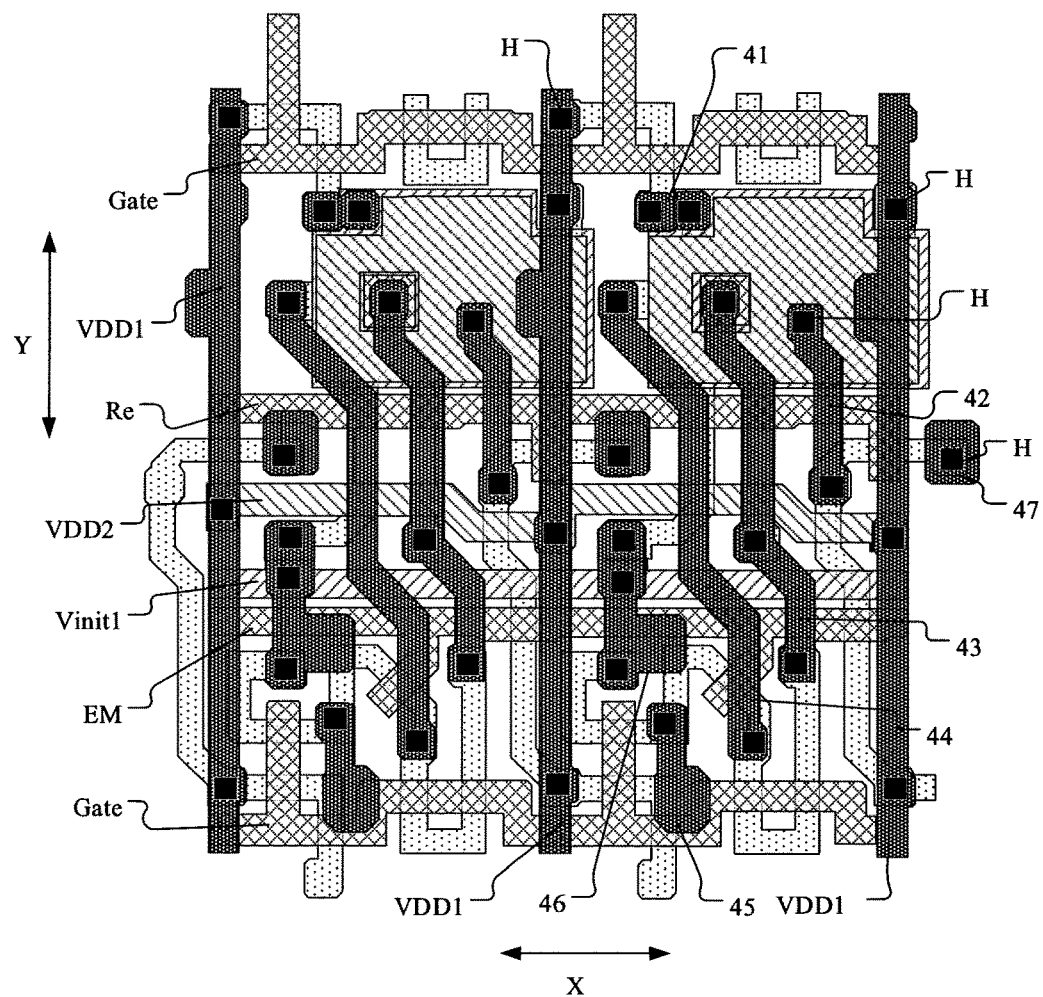
FIG. 14 is a structural layout of the active layer, the first conductive layer, the second conductive layer, the third conductive layer, and the fourth conductive layer in FIG. 4.

In this exemplary embodiment, the display panel may further include a substrate, an active layer, a first conductive layer, a second conductive layer, a third conductive layer, a fourth conductive layer, and a fifth conductive layer stacked in sequence, where insulating layer(s) may be disposed between the above layers. As shown in FIGS. 4-14, FIG. 4 is a structural layout of a display panel according to an exemplary embodiment of the present disclosure, FIG. 5 is a structural layout of an active layer in FIG. 4, FIG. 6 is a structural layout of a first conductive layer in FIG. 4, FIG. 7 is a structural layout of a second conductive layer in FIG. 4, FIG. 8 is a structural layout of a third conductive layer in FIG. 4, FIG. 9 is a structural layout of a fourth conductive layer in FIG. 4, FIG. 10 is a structural layout of a fifth conductive layer in FIG. 4, FIG. 11 is a structural layout of the active layer and the first conductive layer in FIG. 4, FIG. 12 is a structural layout of the active layer, the first conductive layer, and the second conductive layer in FIG. 4, FIG. 13 is a structural layout of the active layer, the first conductive layer, the second conductive layer, and the third conductive layer in FIG. 4, and FIG. 14 is a structural layout of the active layer, the first conductive layer, the second conductive layer, the third conductive layer, and the fourth conductive layer in FIG. 4. The display panel may include the pixel driving circuit shown in FIG. 2.

As shown in FIGS. 4, 5, and 11, the active layer may include a first active portion 61, a third active portion 63, a sixth active portion 66, a seventh active portion 67, an eighth active portion 68, a ninth active portion 69, a tenth active portion 610, an eleventh active portion 611, a twelfth active portion 612, a thirteenth active portion 613, a fourteenth active portion 614, a fifteenth active portion 615, a sixteenth active portion 616, a seventeenth active portion 617, and a eighteenth active portion 618. The first active portion 61 is used to form a channel region of the first transistor T1, the third active portion 63 is used to form a channel region of the drive transistor T3, the sixth active portion 66 is used to form a channel region of the sixth transistor, the seventh active portion 67 is used to form a channel region of the seventh transistor T7, the eighth active portion 68 is used to form a channel region of the eighth transistor, the tenth active portion 610 is used to form a first channel region of the fifth transistor, the eleventh active portion 611 is used to form a second channel region of the fifth transistor, and the twelfth active portion 612 is connected between the tenth active portion 610 and the eleventh active portion 611. The thirteenth active portion 613 is used to form a first channel region of the fourth transistor, the fourteenth active portion 614 is used to form a second channel region of the fourth transistor, the fifteenth active portion 615 is connected between the fourteenth active portion 614 and the thirteenth active portion 613, the sixteenth active portion 616 is used to form a first channel region of the second transistor T2, the seventeenth active portion 617 is used to form a second channel region of the second transistor T2, the eighteenth active portion 618 is connected between the seventeenth active portion 617 and the sixteenth active portion 616, and the ninth active portion 69 is connected to the end of the first active portion 61 away from the seventh active portion 67. The active layer may be formed by a polycrystalline silicon semiconductor, and all of the above transistors may be P-type low temperature polycrystalline silicon thin film transistors.

As shown in FIGS. 4, 6, and 11, the first conductive layer may include a gate drive signal line Gate, a reset signal line Re, an enable signal line EM, a convex portion 12, a convex portions 13, and a convex portion 14. An orthographic projection of the gate drive signal line Gate on the substrate, an orthographic projection of the reset signal line Re on the substrate, and an orthographic projection of an enable signal line EM on the substrate may all extend along the first direction X. The first direction X may be a row direction. The first conductive layer may include a plurality of gate drive signal lines Gate, a plurality of reset signal lines Re, and a plurality of enable signal lines EM, and each row of pixel driving circuits may be provided with one gate drive signal line Gate, one reset signal line Re, and one enable signal line EM correspondingly. The orthographic projection of the gate drive signal line Gate on the substrate may cover an orthographic projection of the sixteenth active portion 616 on the substrate and an orthographic projection of the seventeenth active portion 617 on the substrate, and part of the gate drive signal line Gate may be used to form two gates of the second transistor. The convex portion 12 is connected to the gate drive signal line Gate, an orthographic projection of the convex portion 12 on the substrate can cover an orthographic projection of the sixth active portion 66 on the substrate, and part of the convex portion 12 can be used to form the gate of the sixth transistor T6. An orthographic projection of the enable signal line EM on the substrate may cover an orthographic projection of the seventh active portion 67 on the substrate, and part of the enable signal line EM may be used to form the gate of the seventh transistor T7. The convex portion 14 is connected to the enable signal line, an orthographic projection of the convex portion 14 on the substrate covers an orthographic projection of the eighth active portion 68 on the substrate, and part of the convex portion 14 is used to form the gate of the eighth transistor T8. An orthographic projection of the reset signal line Re on the substrate covers an orthographic projection of the thirteenth active portion 613 on the substrate and an orthographic projection of the fourteenth active portion 614 on the substrate, and part of the reset signal line Re is used to form two gates of the fourth transistor. The convex portion 13 is connected to the reset signal line Re, an orthographic projection of the convex portion 13 on the substrate covers an orthographic projection of the first active portion 61 on the substrate, and part of the convex portion 13 is used to form the gate of the first transistor T1. As shown in FIG. 3, the signal at the first gate drive signal terminal Gate1 and the signal at the second gate drive signal terminal Gate2 have the same waveform and differ only in timing. Therefore, an orthographic projection on the substrate of the gate drive signal line Gate in the previous row of pixel driving circuits can cover an orthographic projection on the substrate of the eleventh active portion 611 in the current row of pixel driving circuits, and part of the gate drive signal line Gate in the previous row of pixel driving circuits may be used to form the second gate of the fifth transistor in the current row of pixel driving circuits, the orthographic projection on the substrate of the convex portion 12 in the previous row of pixel driving circuits may cover an orthographic projection on the substrate of the tenth active portion 610 in the current row of pixel driving circuits, and part of the convex portion 12 in the previous row of pixel driving circuits may be used to form the first gate of the fifth transistor in the current row of pixel driving circuits. This arrangement enables the second transistor and the sixth transistor in the previous row of the pixel driving circuits to share a gate drive signal line with the fifth transistor in the current row of the pixel driving circuits, thereby reducing the layout space of the pixel driving circuits and increasing the pixel density of the display panel. In addition, the first conductive layer may also include a first conductive portion 11, an orthographic projection of the first conductive portion 11 on the substrate may cover an orthographic projection of the third active portion 63 on the substrate, and the first conductive portion 11 may be used to form the first electrode of the first capacitor and the gate of the drive transistor in FIG. 2.

It should be noted that in the display panel of this exemplary embodiment, the first conductive layer may be used as a mask to carry out conductive treatment for the active layer, that is, the active layer covered by the first conductive layer forms the channel regions of the transistors, and the area of the active layer not covered by the first conductive layer forms conductor structures. In addition, in this exemplary embodiment, the orthographic projection of a structure on the substrate extending along a certain direction can be understood that the orthographic projection of the structure on the substrate extends along that direction as a whole, i.e., the orthographic projection of the structure on the substrate may extend straight or bend in that direction.

As shown in FIGS. 4, 7, and 12, the second conductive layer may include a second conductive portion 22 and a first initial signal line Vinit1. An orthographic projection of the second conductive portion 22 on the substrate may at least partially overlap with the orthographic projection of the first conductive portion 11 on the substrate, and the second conductive portion 22 may be used to form the second electrode of the first capacitor C1 and the first electrode of the second capacitor C2. The orthographic projection of the second conductive portion 22 on the substrate at least partially overlaps with an orthographic projection of the fifteenth active portion 615 on the substrate, and the second conductive portion 22 can stabilize the voltage of the fifteenth active portion 615, thereby reducing the leakage current of the fifteenth active portion 615 that flows to the source and drain of the fourth transistor T4. An opening 221 is formed on the second conductive portion 22. An orthographic projection of the first initial signal line Vinit1 on the substrate may extend along the first direction X. The first initial signal line Vinit1 may be used to provide the initial signal terminal in FIG. 2. The second conductive layer may include a plurality of first initial signal lines Vinit1, and each row of pixel driving circuits may be provided with a corresponding first initial signal line Vinit1.

As shown in FIGS. 4, 8, and 13, the third conductive layer may include a third conductive portion 33 and a second power line VDD2. An orthographic projection of the third conductive portion 33 on the substrate may at least partially overlap with the orthographic projection of the second conductive portion 22 on the substrate, and the orthographic projection of the third conductive portion 33 on the substrate may at least partially overlap with the orthographic projection of the first conductive portion 11 on the substrate, and the third conductive portion 33 may be used to form the second electrode of the second capacitor C2. In this exemplary embodiment, the first capacitor C1 and the second capacitor C2 are formed by stacking three conductive layers, which can reduce the layout space of the first capacitor C1 and the second capacitor C2, thereby increasing the pixel density of the display panel. It should be noted that in other exemplary embodiments, as long as the display panel includes the pixel driving circuit shown in FIG. 1, the display panel can use the three conductive layers stacked to reduce the layout space of the first capacitor C1 and the second capacitor C2. In this exemplary embodiment, the orthographic projection of the second conductive portion 22 on the substrate can cover the overlapping area of the orthographic projection of the first conductive portion 11 on the substrate and the orthographic projection of the third conductive portion 33 on the substrate. This arrangement can improve the shielding effect of the second conductive portion 22 on the first conductive portion 11 and the third conductive portion 33. The third conductive portion 33 is formed with an opening 331, an orthographic projection of the opening 331 on the substrate at least partially overlaps with the orthographic projection of the opening 221 on the substrate. An orthographic projection of the second power line VDD2 on the substrate may extend along the first direction X. The third conductive layer may include a plurality of second power lines VDD2 and each row of pixel driving circuits may be provided with a corresponding second power line VDD2.

As shown in FIGS. 4, 9, and 14, the fourth conductive layer may include a plurality of first power lines VDD1, a first connection portion 41, a second connection portion 42, a third connection portion 43, a fourth connection portion 44, a fifth connection portion 45, a sixth connection portion 46, and a seventh connection portion 47. The orthographic projections of the plurality of first power lines VDD1 on the substrate may be spaced apart along the first direction X and extend along a second direction Y. The first direction X may intersect with the second direction Y. For example, the second direction may be a column direction. The plurality of first power lines VDD1 may be provided in a plurality of columns of pixel driving circuits in one-to-one correspondence, one first power line VDD1 is connected to the drive transistor T3 in a corresponding pixel driving circuit and the first power line VDD1 may provide the first power supply terminal in FIG. 1. As shown in FIGS. 4, 9, and 14, the first power line VDD1 may be connected to the active layer on the side of the third active portion 63 through a via hole H to connect the first electrode of the drive transistor T3 to the first power supply terminal. It should be noted that the black squares in FIGS. 4 and 14 denote via holes, and in this exemplary embodiment, only the locations of some of the via holes are annotated. In addition, the first power lines VDD1 can also be connected to the second power lines VDD2 that intersect with the first power lines VDD1 through the via holes, which enables the power lines to form a grid structure, and since the power line in the grid structure has a smaller resistance, the voltage difference of the power lines at different locations of the display panel can be reduced and the display uniformity of the display panel can be improved. It should be understood that in other exemplary embodiments, it is also possible to connect some of the plurality of first power lines with some of the plurality of second power lines through the via holes. The first power line VDD1 may also be connected to the active layer on the side of the seventh active portion 67 away from the first active portion 61 through the via hole to connect the first electrode of the seventh transistor T7 to the first power supply terminal. The first connection portion 41 may connect the second conductive portion 22 and the active layer on the side of the eleventh active portion 611 away from the twelfth active portion 612, respectively, through the via holes to connect the first electrode of the fifth transistor to the second electrode of the first capacitor. The second connection portion 42 may connect the third conductive portion 33 and the active layer between the first active portion 61 and the seventh active portion 67, respectively, through the via holes to connect the second electrode of the first transistor to the second electrode of the second capacitor. The third connection portion 43 may be connected to the first conductive portion 11, the active layer on the side of the fourteenth active portion 614 away from the fifteenth active portion 615, and the active layer on the side of the sixteenth active portion 616 away from the eighteenth active portion 618, respectively, through the via holes to connect the gate of the drive transistor, the second electrode of the fourth transistor, and the first electrode of the second transistor. An orthographic projection on the substrate of the via hole connected between the third connection portion 43 and the first conductive portion 11 is located within the orthographic projection of the opening 221 on the substrate, and within the orthographic projection of the opening 331 on the substrate, in order to avoid the conductive structure within the via hole from being electrically connected to the second conductive portion 22 and the third conductive portion 33. The fourth connection portion 44 may connect the active layer on the other side of the third active portion 63, the active layer between the eighth active portion 68 and the seventeenth active portion 617, respectively, through the via holes to connect the second electrode of the drive transistor, the second electrode of the second transistor, and the first electrode of the eighth transistor. The fifth connection portion 45 connects the active layer between the sixth active portion 66 and the eighth active portion 68 through the via hole to connect the second electrode of the sixth transistor and the second electrode of the eighth transistor, and the fifth connection portion 45 is used to connect the second electrode of the sixth transistor and the second electrode of the eighth transistor to the first electrode of the light emitting unit. The sixth connection portion 46 connects the first initial signal line Vinit1, the active layer on the side of the sixth active portion 66 away from the eighth active portion 68, and the active layer of the thirteenth active portion 613 away from the fifteenth active portion 615, respectively, through via holes to connect the initial signal terminal, the first electrode of the sixth transistor, and the first electrode of the fourth transistor. The seventh connection portion 47 is connected to the ninth active portion 69 through the via hole to connect the first electrode of the first transistor. The first power line VDD1 may form the stabilized power supply terminal as described above, and it should be understood that in other exemplary embodiments, the stabilized power supply terminal as described above can be formed in the display panel through other voltage lines.

As shown in FIGS. 4, 9, and 14, the display panel may include a plurality of pixel driving circuits distributed along the row direction and the column direction, and the plurality of pixel driving circuits may include a first pixel driving circuit P1 and a second pixel driving circuit P2 distributed adjacent to each other in the first direction X. The first power line VDD1 corresponding to the first pixel driving circuit P1 may be connected to the second electrode of the fifth transistor in the second pixel driving circuit through the via hole.

As shown in FIGS. 4 and 10, the fifth conductive layer may include a plurality of data lines Da, a plurality of second initial signal lines Vinit2, a plurality of third power lines VDD3, and a connection portion 51. The connection portion 51 may be connected to the fifth connection portion 45 through the via hole, and the connection portion 51 may be used to connect to the first electrode of the light emitting unit. The data line Da is used to provide the data signal terminal in FIG. 2. The plurality of data lines Da are provided in one-to-one correspondence with a plurality of columns of pixel driving circuits, and one data line Da is connected to the first electrode of the first transistor in a corresponding pixel driving circuit. The data lines Da can be connected to the seventh connection portion 47 through the via hole to connect the first electrode of the first transistor. In this exemplary embodiment, the display panel can be driven row by row from the previous row of pixel driving circuits to the next row of pixel driving circuits, and the data writing phase of the current row of pixel driving circuits can correspond to part of the threshold compensation phase of the previous row of pixel driving circuits, so that when the data signal is written into the current row of pixel driving circuits, the data signal on the data line will cause a noise effect on the third conductive portion in the previous row of pixel driving circuits, which will lead to a change in the voltage of the third node in the previous row of pixel driving circuits and eventually leads to an inaccurate data signal written to the first node in the light-emitting phase. In this exemplary embodiment, in the same pixel driving circuit, an orthographic projection on the substrate of the via hole connected between the seventh connection portion 47 and the ninth active portion 69 may be located on a side, away from the orthographic projection of the third conductive portion 33 on the substrate, of the orthographic projection of the reset signal line Re on the substrate. In addition, in the first direction X, the orthographic projection on the substrate of the via hole connected between the seventh connection portion 47 and the ninth active portion 69 may be located between the orthographic projections of adjacent third conductive portions 33 on the substrate. This arrangement may reduce the noise effect of the signal on the data line Da on the third conductive portion 33 by increasing the distance between this via hole and the third conductive portion 33 and reducing the parasitic capacitance between this via hole and the third conductive portion 33. In addition, the orthographic projection of the data line Da on the substrate may be located between the orthographic projections of the adjacent third conductive portions 33 on the substrate, i.e., the orthographic projection of the data line Da on the substrate does not overlap with the orthographic projection of the third conductive portion 33 on the substrate, which may reduce the noise effect of the signal of the data line Da on the third conductive portion 33 by reducing the parasitic capacitance between the data line Da and the third conductive portion 33. As shown in FIGS. 4 and 10, in the same pixel driving circuit, at least part of the orthographic projection on the substrate of the via hole connected between the seventh connection portion 47 and the data line Da may be located on the side, away from the orthographic projection of the third conductive portion 33 on the substrate, of the orthographic projection of the reset signal line Re on the substrate, which may also reduce the noise effect of the signal of the data line Da on the third conductive portion 33. In addition, in this exemplary embodiment, the data line Da is provided on the fifth conductive layer, which increases the distance between the data line Da and the conductive portion such as the third conductive portion 33, thereby reducing the coupling effect of the data line Da on the conductive portion such as the third conductive portion 33.

As shown in FIGS. 4 and 10, the orthographic projections of the plurality of third power lines VDD3 on the substrate may be spaced apart along the first direction and extend along the second direction. The plurality of third power lines VDD3 may be provided in correspondence with the plurality of first power lines VDD1, and the third power lines VDD3 may be connected to the corresponding first power lines VDD1 through multiple via holes, which can reduce the resistance of the power line. In addition, the orthographic projection of the third power line VDD3 on the substrate may at least partially overlap with the orthographic projection of the corresponding first power line VDD1 on the substrate, in order to reduce the shading effect of the third power line VDD3 on the display panel. It should be understood that in other embodiments, multiple third power lines VDD3 may be provided in correspondence with one first power line VDD1, or, one third power line VDD3 may be provided in correspondence with multiple first power lines VDD1.

As shown in FIGS. 4 and 10, the orthographic projections of the plurality of second initial signal lines Vinit2 on the substrate may be spaced apart along the first direction and extend along the second direction. The plurality of second initial signal lines Vinit2 may be provided in correspondence with the plurality of columns of pixel driving circuits. The second initial signal line Vinit2 can be connected to a plurality of sixth connection portions 46 in the same column of pixel driving circuits through the via holes respectively to connect a plurality of first initial signal lines Vinit1, which can form a grid structure of the initial signal lines, thereby reducing the voltage difference of the initial signal lines at different locations of the display panel, and improving the display uniformity of the display panel. It should be noted that the second initial signal line Vinit2 may be connected to all the sixth connection portions 46 in the same column of pixel driving circuits through respective via holes, or may be connected to some of the sixth connection portions 46 in the same column of pixel driving circuits through respective via holes. The orthographic projection of the second initial signal line Vinit2 on the substrate may at least partially overlap with the orthographic projection of the eighteenth active portion 618 on the substrate, and the second initial signal line Vinit2 may stabilize the voltage of the eighteenth active portion 618, thereby reducing the leakage current of the eighteenth active portion 618 that flows to the source and the drain of the second transistor.

Figure 15:
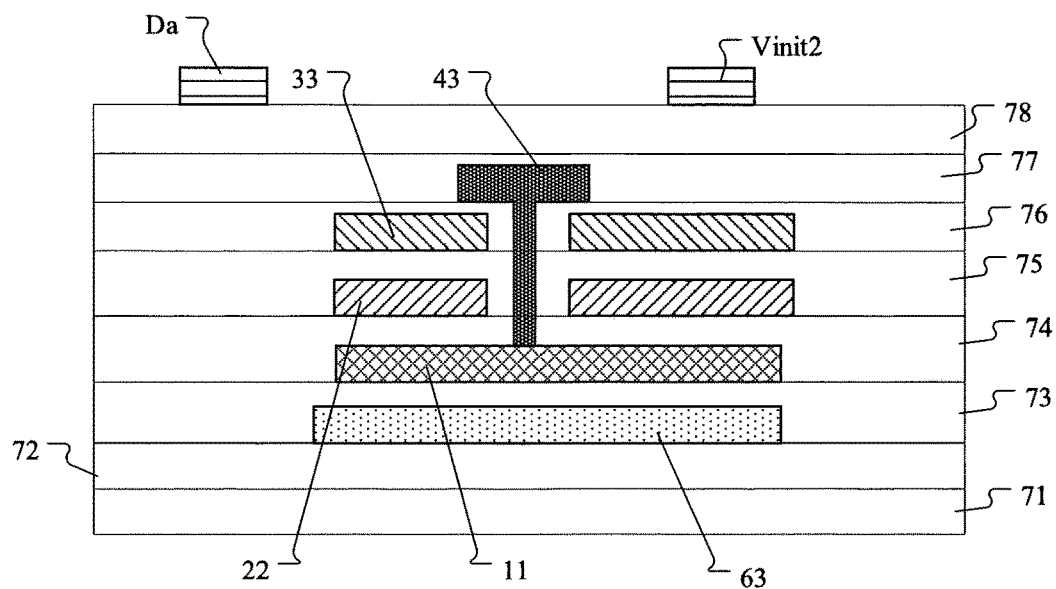
FIG. 15 is a partial sectional view along the dotted line AA in FIG. 4.

FIG. 15 is a partial sectional view along the dotted line AA in FIG. 4. As shown in FIG. 15, the display panel may also include a buffer layer 72, a first insulating layer 73, a second insulating layer 74, a third insulating layer 75, a dielectric layer 76, a passivation layer 77, and a flat layer 78. The substrate 71, the buffer layer 72, the active layer, the first insulating layer 73, the first conductive layer, the second insulating layer 74, the second conductive layer, the third insulating layer 75, the third conductive layer, the dielectric layer 76, the fourth conductive layer, the passivation layer 77, the flat layer 78, and the fifth conductive layer are stacked in sequence. The first insulating layer 73, the second insulating layer 74, and third insulating layer 75 may be silicon oxide layers. The dielectric layer 76 and the passivation layer 77 may be silicon nitride layers. The flat layer 78 may be made of organic materials, such as polyimide (PI), polyethylene terephthalate (PET), polyethylene naphthalate two formic acid glycol ester (PEN), silicon on glass (SOG) bonding structure, and other materials. The substrate 71 may include a glass substrate, a barrier layer, and a polyimide layer stacked in sequence, and the barrier layer may be made of inorganic materials. The material of the first conductive layer, the second conductive layer, and the third conductive layer may be one of molybdenum, aluminum, copper, titanium, and niobium, or may be an alloy, or may be molybdenum/titanium alloy, or may be laminated molybdenum and titanium, etc. The material of the fourth conductive layer and the fifth conductive layer may include metal materials, e.g., one of molybdenum, aluminum, copper, titanium, and niobium, or may be an alloy, or may be molybdenum/titanium alloy, or may be laminated molybdenum and titanium, etc., or may be laminated titanium/aluminum/titanium. The material of the fourth conductive layer may be indium tin oxide.

Figure 16:
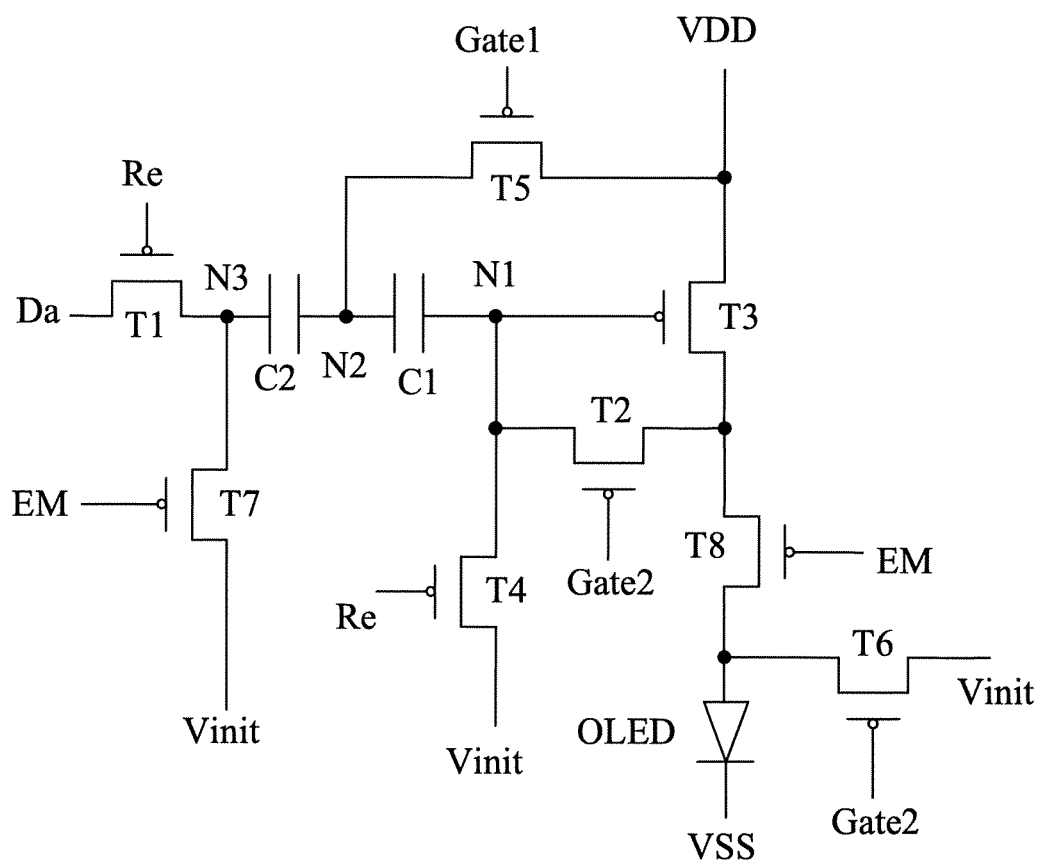
FIG. 16 is a schematic diagram of a structure of a pixel driving circuit in the display panel according to yet another exemplary embodiment of the present disclosure.

FIG. 16 is a schematic diagram of a structure of a pixel driving circuit in the display panel according to yet another exemplary embodiment of the present disclosure. The pixel driving circuit shown in FIG. 16 differs from the pixel driving circuit shown in FIG. 2 only in that the first electrode of the seventh transistor is connected to the initial signal terminal. The pixel driving circuit shown in FIG. 16 can be driven in the same way as the pixel driving circuit shown in FIG. 2.

Figure 17:
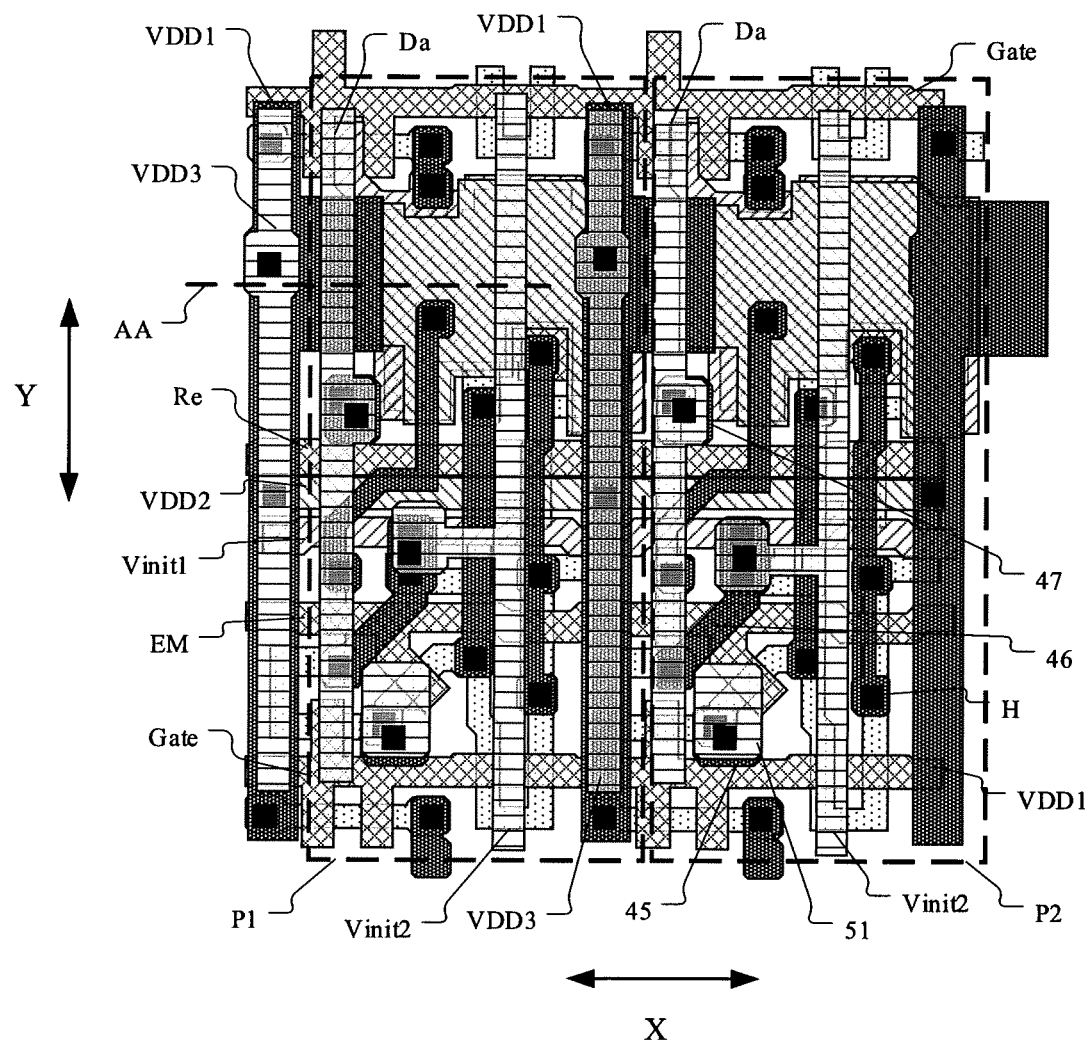
FIG. 17 is a structural layout of a display panel according to another exemplary embodiment of the present disclosure.
Figure 18:
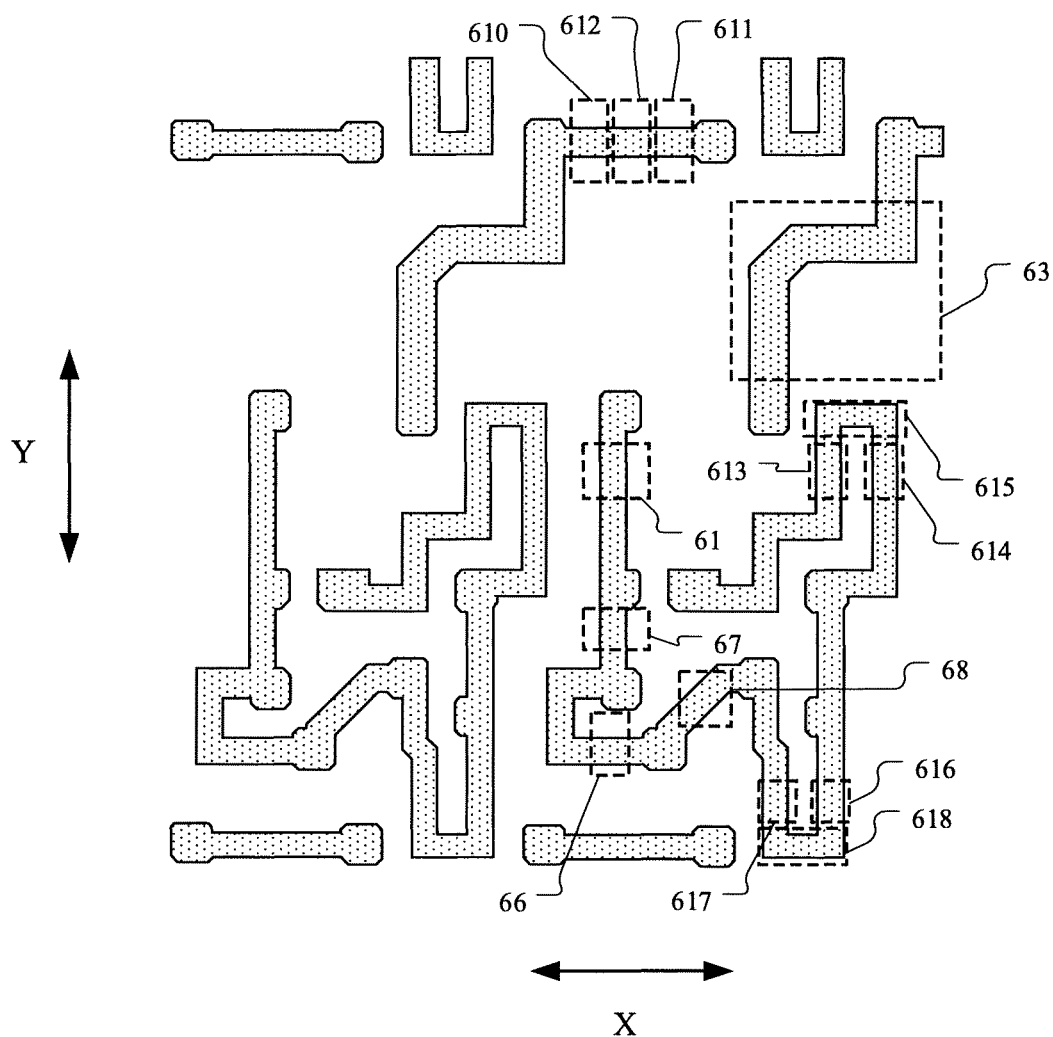
FIG. 18 is a structural layout of an active layer in FIG. 17.
Figure 19:
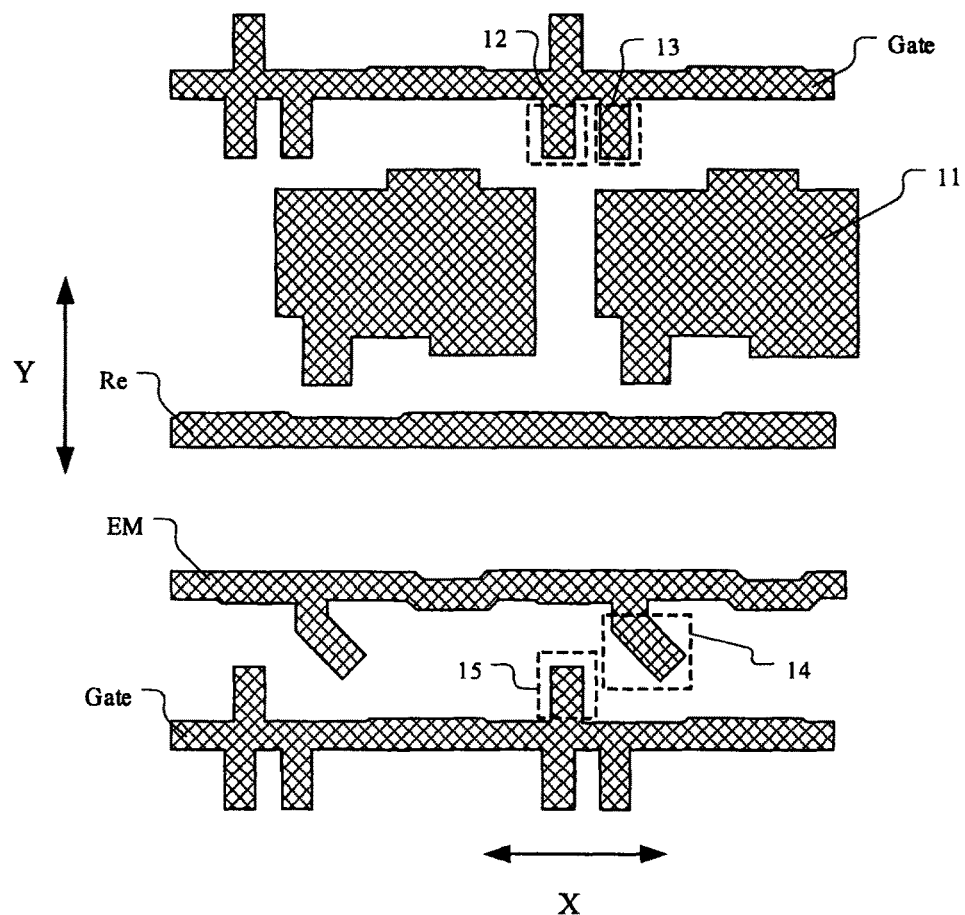
FIG. 19 is a structural layout of a first conductive layer in FIG. 17.
Figure 20:
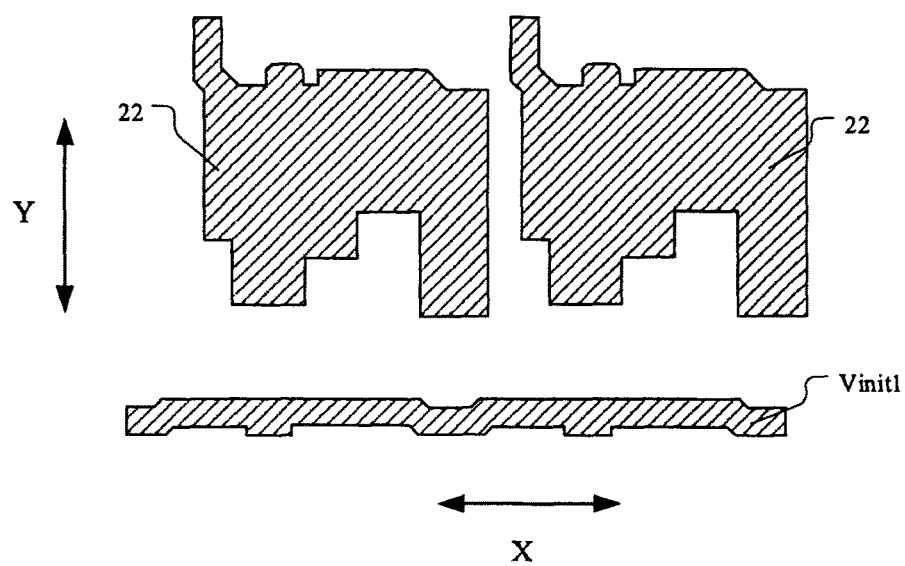
FIG. 20 is a structural layout of a second conductive layer in FIG. 17.
Figure 21:
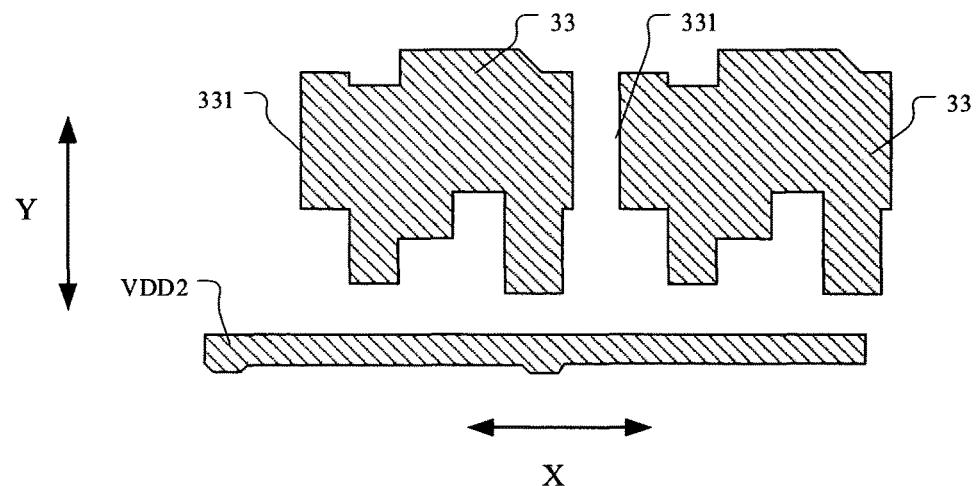
FIG. 21 is a structural layout of a third conductive layer in FIG. 17.
Figure 22:
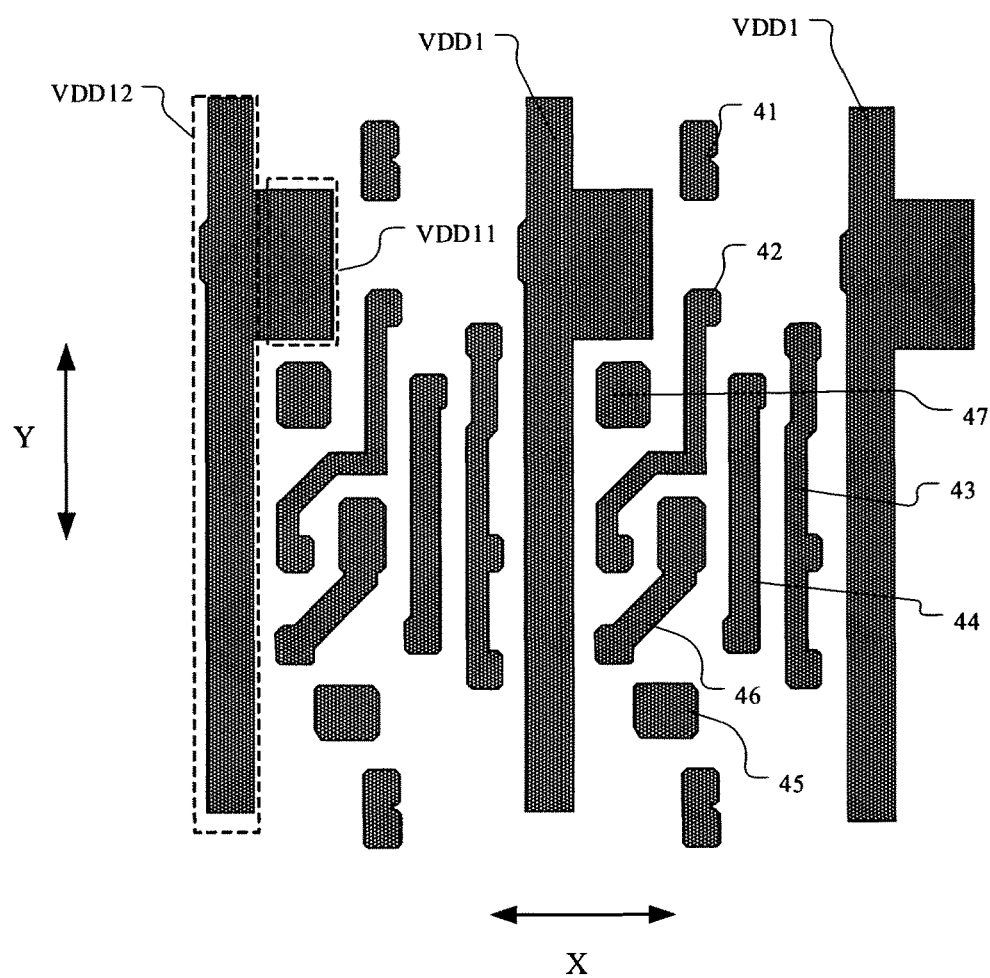
FIG. 22 is a structural layout of a fourth conductive layer in FIG. 17.
Figure 23:
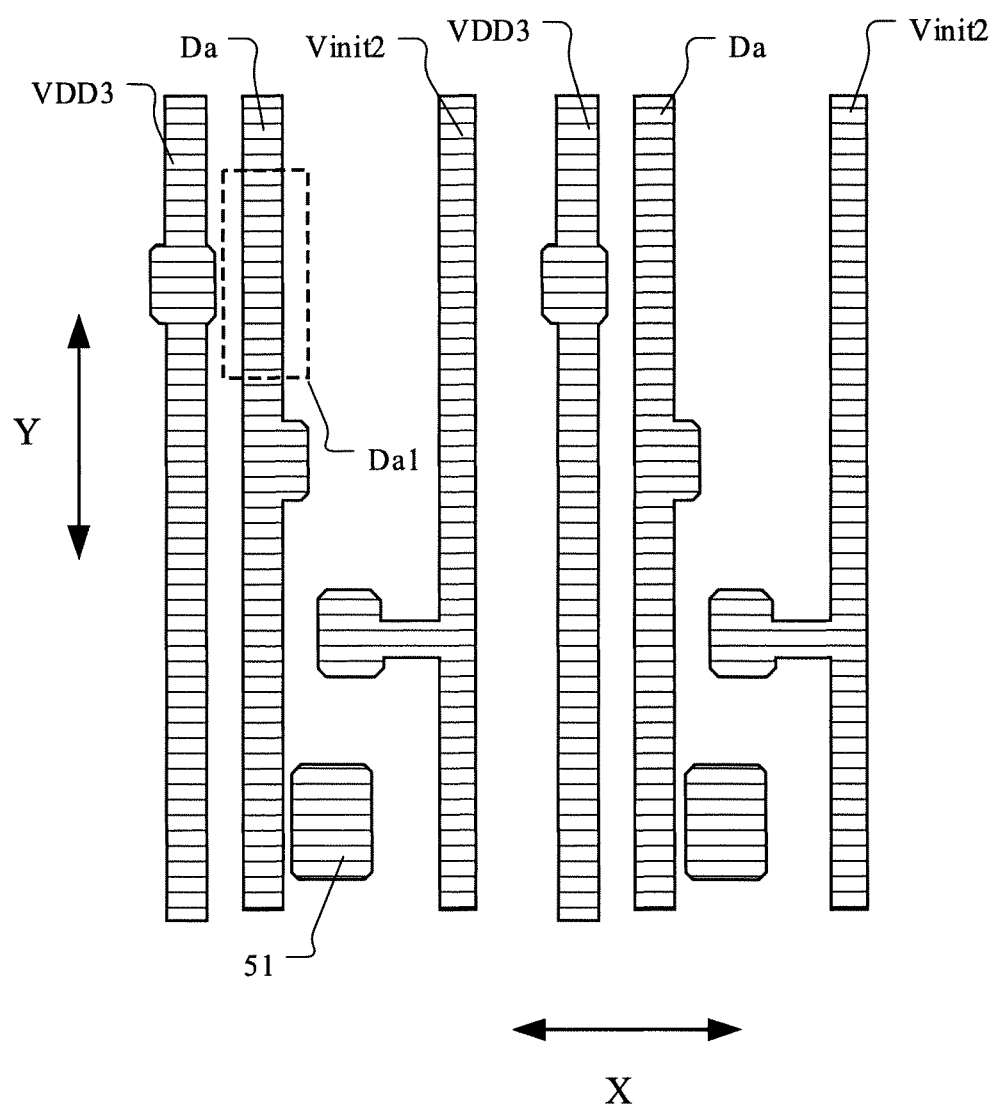
FIG. 23 is a structural layout of a fifth conductive layer in FIG. 17.
Figure 24:
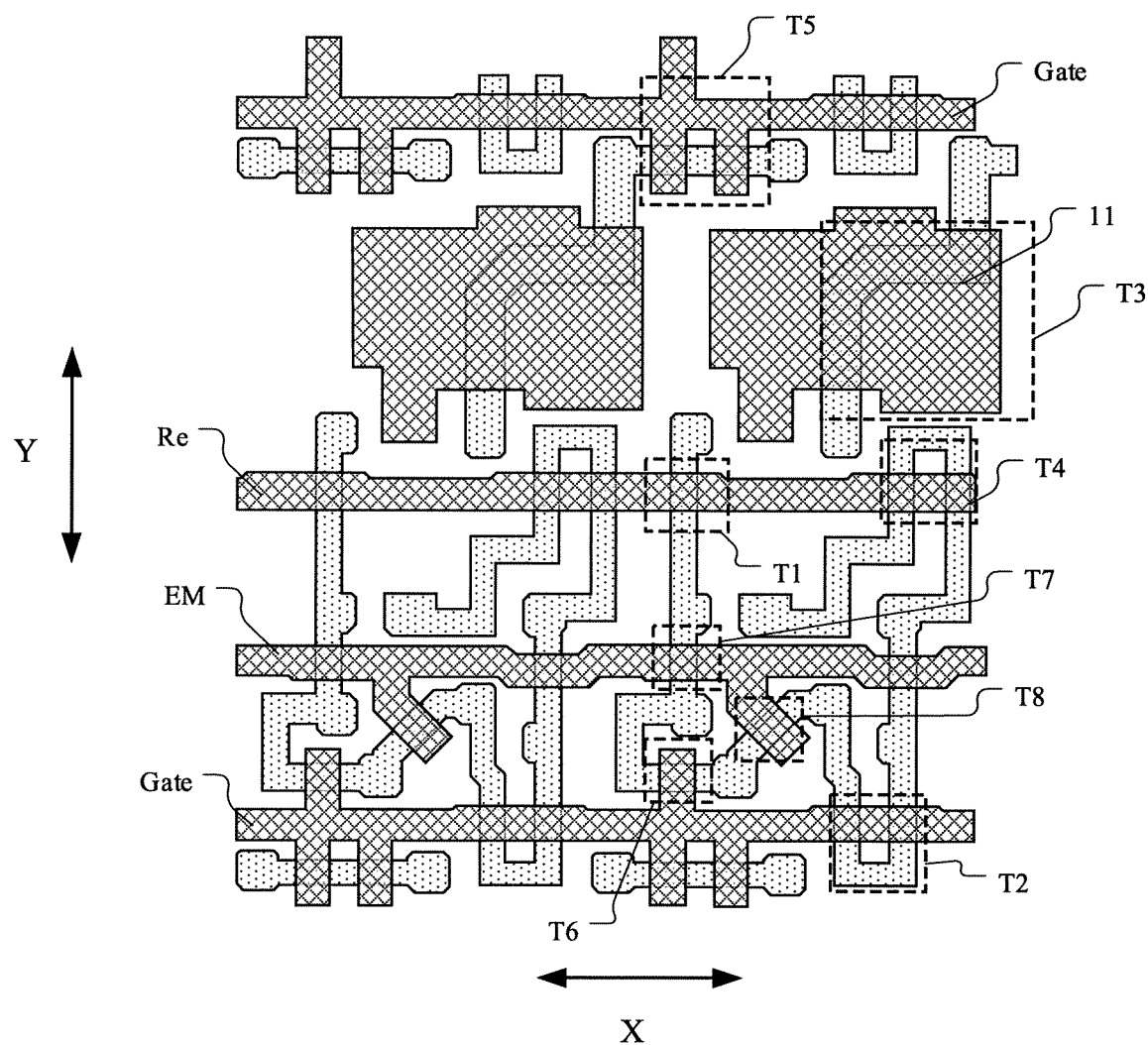
FIG. 24 is a structural layout of the active layer and the first conductive layer in FIG. 17.
Figure 25:
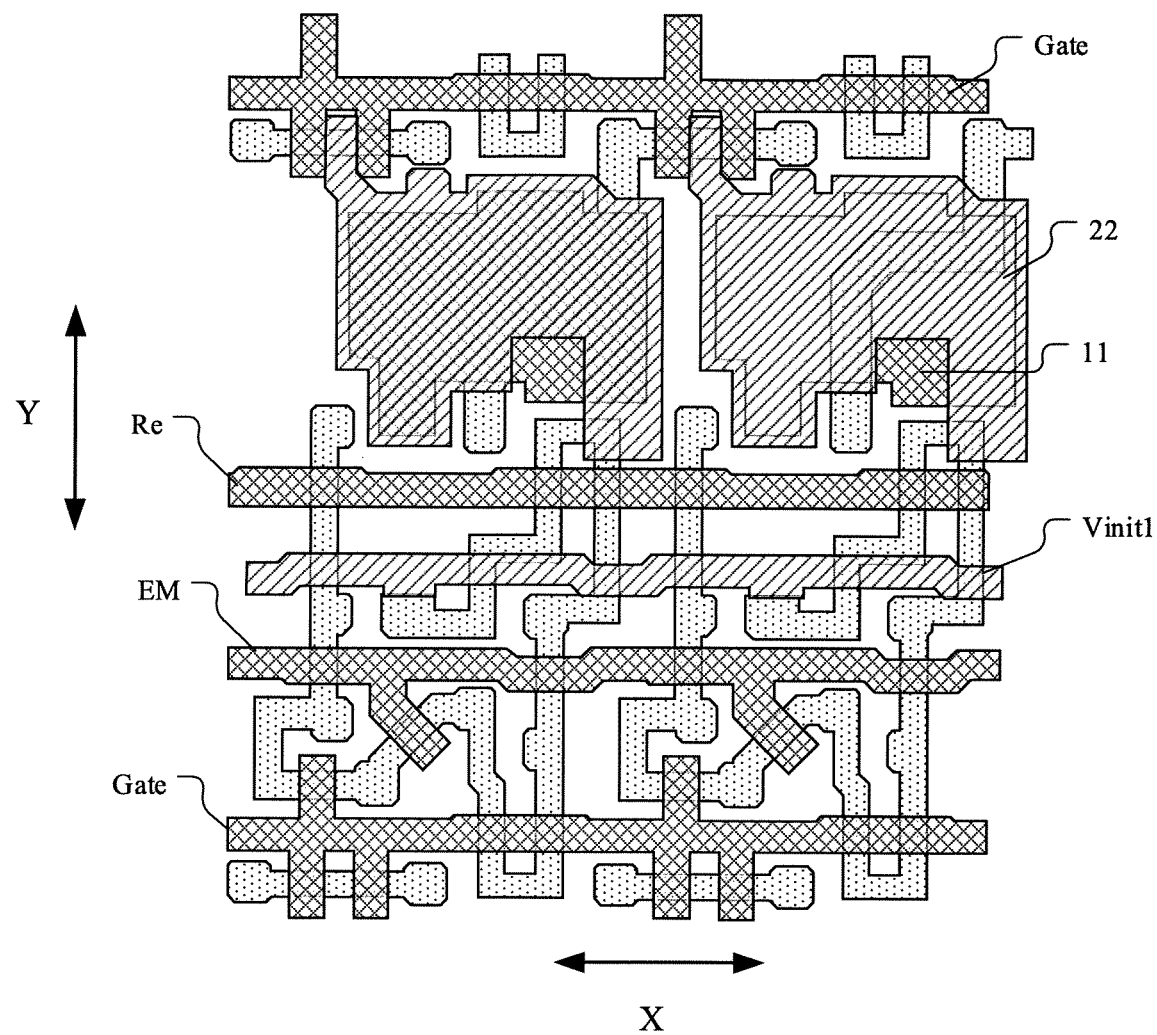
FIG. 25 is a structural layout of the active layer, the first conductive layer, and the second conductive layer in FIG. 17.
Figure 26:
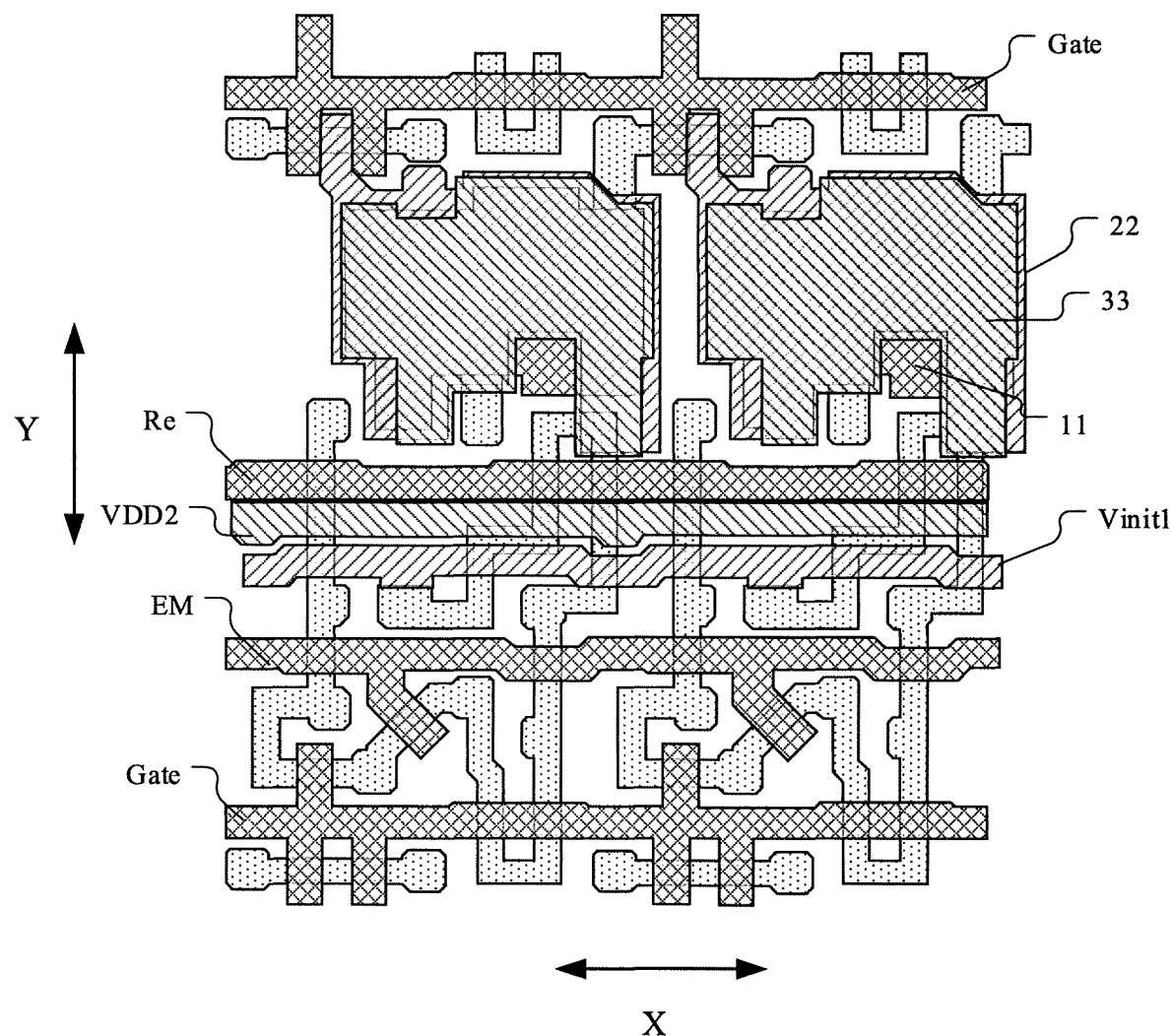
FIG. 26 is a structural layout of the active layer, the first conductive layer, the second conductive layer, and the third conductive layer in FIG. 17.
Figure 27:
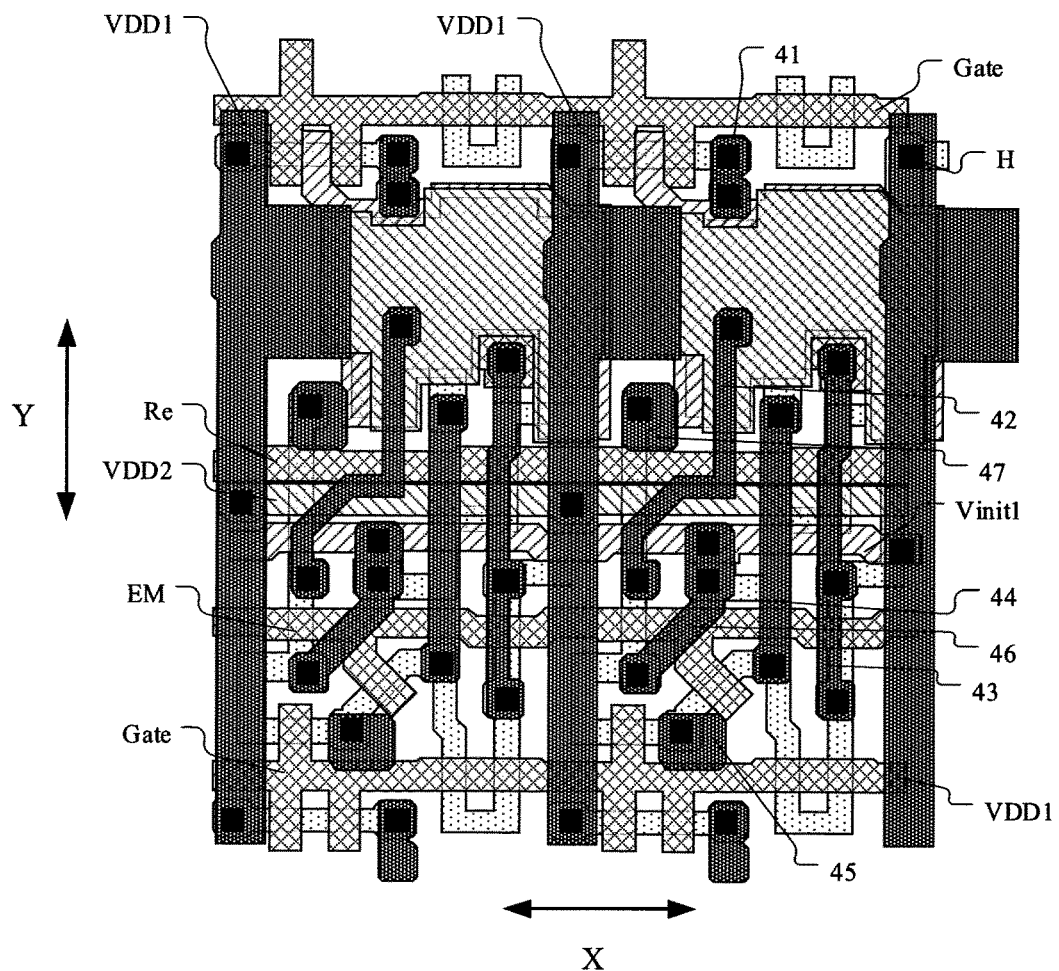
FIG. 27 is a structural layout of the active layer, the first conductive layer, the second conductive layer, the third conductive layer, and the fourth conductive layer in FIG. 17.

As shown in FIGS. 17-27, FIG. 17 is a structural layout of a display panel according to another exemplary embodiment of the present disclosure, FIG. 18 is a structural layout of an active layer in FIG. 17, FIG. 19 is a structural layout of a first conductive layer in FIG. 17, FIG. 20 is a structural layout of a second conductive layer in FIG. 17, FIG. 21 is a structural layout of a third conductive layer in FIG. 17, FIG. 22 is a structural layout of a fourth conductive layer in FIG. 17, FIG. 23 is a structural layout of a fifth conductive layer in FIG. 17, FIG. 24 is a structural layout of the active layer and the first conductive layer in FIG. 17, FIG. 25 is a structural layout of the active layer, the first conductive layer, and the second conductive layer in FIG. 17, FIG. 26 is a structural layout of the active layer, the first conductive layer, the second conductive layer, and the third conductive layer in FIG. 17, and FIG. 27 is a structural layout of the active layer, the first conductive layer, the second conductive layer, the third conductive layer, and the fourth conductive layer in FIG. 17. The display panel may include the pixel driving circuit shown in FIG. 16.

As shown in FIGS. 17, 18, and 24, the active layer may include a first active portion 61, a third active portion 63, a sixth active portion 66, a seventh active portion 67, an eighth active portion 68, a tenth active portion 610, an eleventh active portion 611, a twelfth active portion 612, a thirteenth active portion 613, a fourteenth active portion 614, a fifteenth active portion 615, a sixteenth active portion 616, a seventeenth active portion 617, and a eighteenth active portion 618. The first active portion 61 is used to form a channel region of the first transistor T1, the third active portion 63 is used to form a channel region of the drive transistor T3, the sixth active portion 66 is used to form a channel region of the sixth transistor T6, the seventh active portion 67 is used to form a channel region of the seventh transistor T7, the eighth active portion 68 is used to form a channel region of the eighth transistor T8, the tenth active portion 610 is used to form a first channel region of the fifth transistor T5, the eleventh active portion 611 is used to form a second channel region of the fifth transistor T5, and the twelfth active portion 612 is connected between the tenth active portion 610 and the eleventh active portion 611. The thirteenth active portion 613 is used to form a first channel region of the fourth transistor T4, the fourteenth active portion 614 is used to form a second channel region of the fourth transistor T4, the fifteenth active portion 615 is connected between the fourteenth active portion 614 and the thirteenth active portion 613, the sixteenth active portion 616 is used to form a first channel region of the second transistor T2, the seventeenth active portion 617 is used to form a second channel region of the second transistor T2, the eighteenth active portion 618 is connected between the seventeenth active portion 617 and the sixteenth active portion 616. The active layer may be formed by a polycrystalline silicon semiconductor, and all of the above transistors may be P-type low temperature polycrystalline silicon thin film transistors.

As shown in FIGS. 17, 19, and 24, the first conductive layer may include a gate drive signal line Gate, a reset signal line Re, an enable signal line EM, a convex portion 12, a convex portions 13, a convex portion 14, and a convex portion 15. An orthographic projection of the gate drive signal line Gate on the substrate, an orthographic projection of the reset signal line Re on the substrate, and an orthographic projection of an enable signal line EM on the substrate may all extend along the first direction X. The first direction X may be a row direction. The first conductive layer may include a plurality of gate drive signal lines Gate, a plurality of reset signal lines Re, and a plurality of enable signal lines EM, and each row of pixel driving circuits may be provided with one gate drive signal line Gate, one reset signal line Re, and one enable signal line EM correspondingly. The gate drive signal line Gate may be connected to the second transistor in the corresponding pixel driving circuit. The orthographic projection of the gate drive signal line Gate on the substrate may cover an orthographic projection of the sixteenth active portion 616 on the substrate and an orthographic projection of the seventeenth active portion 617 on the substrate, and part of the gate drive signal line Gate may be used to form two gates of the second transistor. The convex portion 12, the convex portion 13, and the convex portion 15 are connected to the gate drive signal lines Gate. An orthographic projection of the convex portion 12 on the substrate can cover an orthographic projection of the tenth active portion 610 on the substrate, and part of the convex portion 12 can be used to form the first gate of the fifth transistor T5. An orthographic projection of the convex portion 13 on the substrate can cover an orthographic projection of the eleventh active portion 611 on the substrate, and part of the convex portion 13 can be used to form the second gate of the fifth transistor T5. An orthographic projection of the convex portion 15 on the substrate can cover an orthographic projection of the sixth active portion 66 on the substrate, and part of the convex portion 15 can be used to form the gate of the sixth transistor. As shown in FIG. 3, the signal at the first gate drive signal terminal Gate1 and the signal at the second gate drive signal terminal Gate2 have the same waveform and differ only in timing. Therefore, the orthographic projection on the substrate of the convex portion 12 in the previous row of pixel driving circuits can cover the orthographic projection on the substrate of the tenth active portion 610 in the current row of pixel driving circuits, the orthographic projection on the substrate of the convex portion 13 in the previous row of pixel driving circuits can cover the orthographic projection on the substrate of the eleventh active portion 611 in the current row of pixel driving circuits, and the gate drive signal line Gate in the previous row of pixel driving circuits can be connected to the gate of the fifth transistor in the current row of pixel driving circuits, i.e., the first gate drive signal terminal in the current row of pixel driving circuits can be provided by the gate drive signal line in the previous row. This arrangement can reduce the layout area of the pixel driving circuit and increase the pixel density of the display panel. The orthographic projection of the enable signal line EM on the substrate can cover the orthographic projection of the seventh active portion 67 on the substrate, and part of the enable signal line EM can be used to form the gate of the seventh transistor T7. The convex portion 14 is connected to the enable signal line, the orthographic projection of the convex portion 14 on the substrate covers the orthographic projection of the eighth active portion 68 on the substrate, and part of the convex portion 14 is used to form the gate of the eighth transistor T8. The orthographic projection of the reset signal line Re on the substrate covers the orthographic projection of the thirteenth active portion 613 on the substrate, the orthographic projection of the fourteenth active portion 614 on the substrate, and the orthographic projection of the first active portion 61 on the substrate, and part of the reset signal line Re is used to form the two gates of the fourth transistor T4, and the other part of the reset signal line Re is used to form the gate of the first transistor T1. In addition, the first conductive layer may also include a first conductive portion 11, and an orthographic projection of the first conductive portion 11 on the substrate may cover the orthographic projection of the third active portion 63 on the substrate, and the first conductive portion 11 may be used to form the first electrode of the first capacitor and the gate of the drive transistor in FIG. 2.

It should be noted that in the display panel of this exemplary embodiment, the first conductive layer may be used as a mask to carry out conductive treatment for the active layer, that is, the active layer covered by the first conductive layer forms the channel regions of the transistors, and the area of the active layer not covered by the first conductive layer forms conductor structures.

As shown in FIGS. 17, 20, and 25, the second conductive layer may include a second conductive portion 22 and a first initial signal line Vinit1. An orthographic projection of the second conductive portion 22 on the substrate may at least partially overlap with the orthographic projection of the first conductive portion 11 on the substrate, and the second conductive portion 22 may be used to form the second electrode of the first capacitor C1 and the first electrode of the second capacitor C2. The orthographic projection of the second conductive portion 22 on the substrate at least partially overlaps with an orthographic projection of the fifteenth active portion 615 on the substrate, and the second conductive portion 22 can provide voltage stabilization and shielding function to the fifteenth active portion 615, thereby reducing the leakage current of the fifteenth active portion 615 that flows to the source and drain of the fourth transistor T4. The orthographic projection of the second conductive portion 22 on the substrate at least partially overlaps with the orthographic projection of the twelfth active portion 612 on the substrate, and the second conductive portion 22 can stabilize the voltage and shield the twelfth active portion 612, thereby reducing the leakage current of the twelfth active portion 612 that flows to the source and drain of the second transistor T2. A plurality of first initial signal lines Vinit1 may be provided, and the plurality of first initial signal lines Vinit1 may be provided in correspondence with a plurality of rows of pixel driving circuits, and orthographic projections of the plurality of first initial signal lines Vinit1 on the substrate may extend along the first direction X and be spaced apart along the second direction Y. The second direction Y may intersect with the first direction X. For example, the second direction may be a column direction. The first initial signal line Vinit1 may be used to provide the initial signal terminal in FIG. 2.

As shown in FIGS. 17, 21, and 26, the third conductive layer may include a third conductive portion 33 and a second power line VDD2. An orthographic projection of the third conductive portion 33 on the substrate may at least partially overlap with the orthographic projection of the second conductive portion 22 on the substrate, and the orthographic projection of the third conductive portion 33 on the substrate may at least partially overlap with the orthographic projection of the first conductive portion 11 on the substrate, and the third conductive portion 33 may be used to form the second electrode of the second capacitor C2. In this exemplary embodiment, the first capacitor C1 and the second capacitor C2 are formed by stacking three conductive layers, which can reduce the layout space of the first capacitor C1 and the second capacitor C2, thereby increasing the pixel density of the display panel. An orthographic projection of the second power line VDD2 on the substrate may extend along the first direction X. The third conductive layer may include a plurality of second power lines VDD2 and each row of pixel driving circuits may be provided with a corresponding second power line VDD2.

As shown in FIGS. 17, 22, and 27, the fourth conductive layer may include a plurality of first power lines VDD1, a first connection portion 41, a second connection portion 42, a third connection portion 43, a fourth connection portion 44, a fifth connection portion 45, a sixth connection portion 46, and a seventh connection portion 47. The orthographic projections of the plurality of first power lines VDD1 on the substrate may be spaced apart along the first direction X and extend along a second direction Y. The plurality of first power lines VDD1 may be provided in a plurality of columns of pixel driving circuits in one-to-one correspondence, one first power line VDD1 is connected to the drive transistor T3 in a corresponding pixel driving circuit and the first power line VDD1 may provide the first power supply terminal in FIG. 1. As shown in FIGS. 17, 22, and 27, the first power line VDD1 may be connected to the active layer on the side of the third active portion 63 through a via hole H to connect the first electrode of the drive transistor to the first power supply terminal. It should be noted that the black squares in FIGS. 17 and 27 denote via holes, and in this exemplary embodiment, only the locations of some of the via holes are annotated. In addition, the first power line VDD1 can also be connected to the second power line VDD2 that intersects with the first power line VDD1 through the via hole, which enables the power lines to form a grid structure, and since the power line in the grid structure has a smaller resistance, the voltage difference of the power lines at different locations of the display panel can be reduced and the display uniformity of the display panel can be improved. The first connection portion 41 may connect the second conductive portion 22 and the active layer on the side of the eleventh active portion 611 away from the twelfth active portion 612, respectively, through the via holes to connect the first electrode of the fifth transistor to the second electrode of the first capacitor. The second connection portion 42 may connect the third conductive portion 33 and the active layer between the first active portion 61 and the seventh active portion 67, respectively, through the via holes to connect the second electrode of the first transistor to the second electrode of the second capacitor. The third connection portion 43 may be connected to the first conductive portion 11, the active layer on the side of the fourteenth active portion 614 away from the fifteenth active portion 615, and the active layer on the side of the sixteenth active portion 616 away from the eighteenth active portion 618, respectively, through the via holes to connect the gate of the drive transistor, the second electrode of the fourth transistor, and the first electrode of the second transistor. The fourth connection portion 44 may connect the active layer on the other side of the third active portion 63, the active layer between the eighth active portion 68 and the seventeenth active portion 617, respectively, through the via holes to connect the second electrode of the drive transistor, the second electrode of the second transistor, and the first electrode of the eighth transistor. The fifth connection portion 45 connects the active layer between the sixth active portion 66 and the eighth active portion 68 through the via hole to connect the second electrode of the sixth transistor and the second electrode of the eighth transistor, and the fifth connection portion 45 is used to connect the second electrode of the sixth transistor and the second electrode of the eighth transistor to the first electrode of the light emitting unit. The sixth connection portion 46 connects the first initial signal line Vinit1, the active layer between the sixth active portion 66 and the seventh active portion 67, and the active layer on the side of the thirteenth active portion 613 away from the fifteenth active portion 615, respectively, through via holes to connect the initial signal terminal, the first electrode of the sixth transistor, the first electrode of the fourth transistor, and the first electrode of the seventh transistor. The seventh connection portion 47 is connected to the active layer on the side of the first active portion 61 away from the seventh active portion 67 through the via hole to connect to the first electrode of the first transistor. The first power line VDD1 may form the stabilized power supply terminal as described above, and it should be understood that in other exemplary embodiments, the stabilized power supply terminal as described above can be formed in the display panel through other voltage lines.

As shown in FIGS. 17, 22, and 27, the display panel may include a plurality of pixel driving circuits distributed in an array along the row direction and the column direction, and the plurality of pixel driving circuits may include a first pixel driving circuit P1 and a second pixel driving circuit P2 distributed adjacent to each other in the first direction X. The first power line VDD1 corresponding to the first pixel driving circuit P1 may be connected to the second electrode of the fifth transistor in the second pixel driving circuit through the via hole.

As shown in FIGS. 17 and 23, the fifth conductive layer may include a plurality of data lines Da, a plurality of second initial signal lines Vinit2, a plurality of third power lines VDD3, and a connection portion 51. The data line Da is used to provide the data signal terminal in FIG. 2. The plurality of data lines Da are provided in one-to-one correspondence with a plurality of columns of pixel driving circuits, and one data line Da is connected to the first electrode of the first transistor in a corresponding pixel driving circuit. The data lines Da can be connected to the seventh connection portion 47 through the via hole to connect the first electrode of the first transistor. As shown in FIGS. 17 and 22, the first power line VDD1 may include a first protrusion VDD11 and a second extension VDD12, an orthographic projection of the second extension VDD12 on the substrate extends along the second direction Y, and the first protrusion VDD11 is connected to the second extension VDD12. In the same pixel driving circuit, the orthographic projection of the third conductive portion 33 on the substrate is located between the orthographic projection of the first power line VDD1 on the substrate and the orthographic projection of the data line Da on the substrate. The orthographic projection of the first protrusion VDD11 on the substrate is located on the side, away from the orthographic projection of the data line Da on the substrate, of the orthographic projection of the second extension VDD12 on the substrate. As shown in FIGS. 17 and 21, the third conductive portion 33 includes a first edge 331 facing the data line Da, and an orthographic projection of the first edge 311 on the substrate extends along the second direction Y. The data line Da may include a first extension Dal, which is provided opposite to the first edge 331 in the first direction X in the same pixel driving circuit. The first extension Dal being provided opposite to the first edge 331 in the first direction X can be understood as that the area covered by the orthographic projection of the first extension Dal on the substrate after moving infinitely in the first direction, overlaps with the area covered by the orthographic projection of the first edge 331 on the substrate after moving infinitely in the first direction. The orthographic projection on the substrate of the first protrusion VDD11 of the first power line in the first pixel driving circuit P1 can cover the orthographic projection on the substrate of the first extension Dal in the second pixel driving circuit P2, and the orthographic projection on the substrate of the first protrusion VDD11 of the first power line in the first pixel driving circuit P1 covers the orthographic projection on the substrate of the first edge 331 in the second pixel driving circuit P2. This arrangement can shield the noise effect of the data line Da on the third conductive portion 33 through the first power line VDD1. The connection portion 51 can be connected to the fifth connection portion 45 through the via hole, and the connection portion 51 can be used to connect to the first electrode of the light emitting unit.

As shown in FIGS. 17 and 23, the orthographic projections of the plurality of third power lines VDD3 on the substrate can be spaced apart along the first direction and extend along the second direction. The plurality of third power lines VDD3 may be provided in correspondence with the plurality of first power lines VDD1, and the third power lines VDD3 may be connected to the corresponding first power lines VDD1 through multiple via holes, which can reduce the resistance of the power line. In addition, the orthographic projection of the third power line VDD3 on the substrate may at least partially overlap with the orthographic projection of the first power line VDD1 on the substrate, in order to reduce the shading effect of the third power line VDD3 on the display panel. It should be understood that in other embodiments, multiple third power lines VDD3 may be provided in correspondence with one first power line VDD1, or, one third power line VDD3 may be provided in correspondence with multiple first power lines VDD1.

As shown in FIGS. 17 and 23, the orthographic projections of the plurality of second initial signal lines Vinit2 on the substrate may be spaced apart along the first direction and extend along the second direction. The plurality of second initial signal lines Vinit2 may be provided in correspondence with the plurality of columns of pixel driving circuits. The second initial signal line Vinit2 can be connected to the sixth connection portion 46 through the via hole to connect the first initial signal line Vinit1, which can form a grid structure of the initial signal lines, thereby reducing the voltage difference of the initial signal lines at different locations of the display panel, and improving the display uniformity of the display panel. The orthographic projection of the second initial signal line Vinit2 on the substrate may at least partially overlap with the orthographic projection of the eighteenth active portion 618 on the substrate, and the second initial signal line Vinit2 may stabilize the voltage of the eighteenth active portion 618, thereby reducing the leakage current of the eighteenth active portion 618 that flows to the source and the drain of the second transistor.

Figure 28:
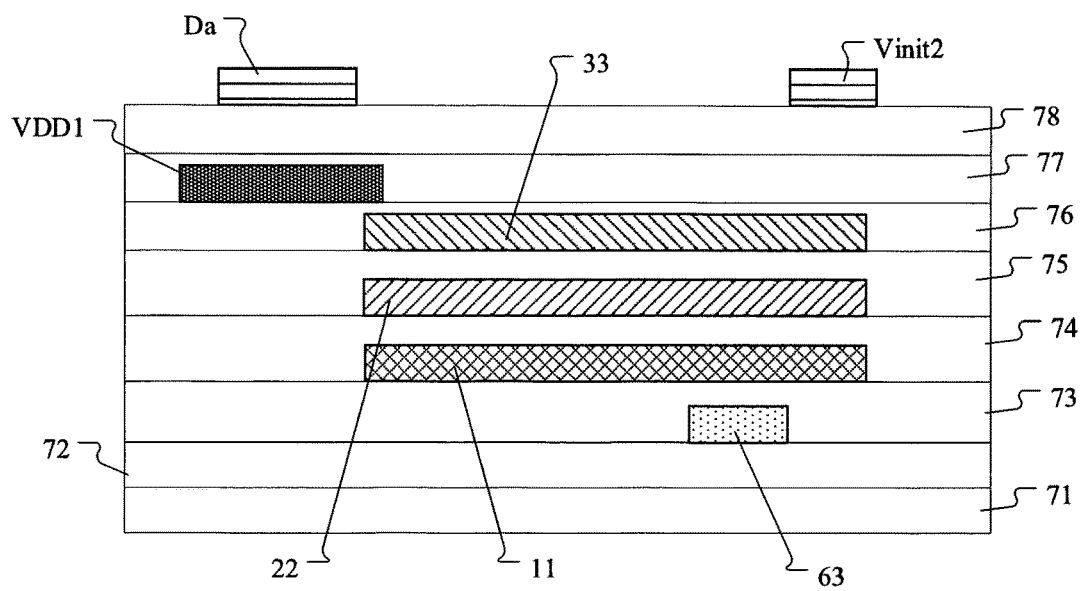
FIG. 28 is a partial sectional view along the dotted line AA in FIG. 17.

FIG. 28 is a partial sectional view along the dotted line AA in FIG. 17. As shown in FIG. 28, the display panel may also include a buffer layer 72, a first insulating layer 73, a second insulating layer 74, a third insulating layer 75, a dielectric layer 76, a passivation layer 77, and a flat layer 78. The substrate 71, the buffer layer 72, the active layer, the first insulating layer 73, the first conductive layer, the second insulating layer 74, the second conductive layer, the third insulating layer 75, the third conductive layer, the dielectric layer 76, the fourth conductive layer, the passivation layer 77, the flat layer 78, and the fifth conductive layer are stacked in sequence. The first insulating layer 73, the second insulating layer 74, and third insulating layer 75 may be silicon oxide layers. The dielectric layer 76 and the passivation layer 77 may be silicon nitride layers. The flat layer 78 may be made of organic materials, such as polyimide (PI), polyethylene terephthalate (PET), polyethylene naphthalate two formic acid glycol ester (PEN), silicon on glass (SOG) bonding structure, and other materials. The substrate 71 may include a glass substrate, a barrier layer, and a polyimide layer stacked in sequence, and the barrier layer may be made of inorganic materials. The material of the first conductive layer, the second conductive layer, and the third conductive layer may be one of molybdenum, aluminum, copper, titanium, and niobium, or may be an alloy, or may be molybdenum/titanium alloy, or may be laminated molybdenum and titanium, etc. The material of the fourth conductive layer and the fifth conductive layer may include metal materials, e.g., one of molybdenum, aluminum, copper, titanium, and niobium, or may be an alloy, or may be molybdenum/titanium alloy, or may be laminated molybdenum and titanium, etc., or may be laminated titanium/aluminum/titanium. The material of the fourth conductive layer may be indium tin oxide.

In other exemplary embodiments, when at least some of the first transistor T1, the second transistor T2, the fourth transistor T4, the fifth transistor T5, the sixth transistor T6, the seventh transistor T7, and the eighth transistor T8 are N-type transistors, the channel region of the N-type transistor may be located between the second conductive layer and the third conductive layer, the top gate of the N-type transistor may be located in the third conductive layer, and the bottom gate of the N-type transistor may be located in the second conductive layer.

The exemplary embodiments of the present disclosure further provide a display device, which includes the display panel as described above. The display device may be a display device such as a mobile phone, a tablet computer, and a TV.

Other embodiments of the present disclosure will be readily apparent to those skilled in the art upon consideration of the specification and practice of the content disclosed herein. This application is intended to cover any variation, use, or adaptation of the present disclosure that follows the general principles of the present disclosure and includes commonly known or customary technical means in the art not disclosed herein. The specification and embodiments are to be considered exemplary only, and the true scope and spirit of the disclosure is indicated by the appended claims.

It should be understood that the present disclosure is not limited to the precise structure already described above and illustrated in the accompanying drawings, and may be modified and changed in various ways without departing from the scope thereof. The scope of the present disclosure is limited only limited by the appended claims.

What is claimed is:

1. A display panel, comprising a pixel driving circuit, wherein the pixel driving circuit comprises:
   a drive transistor, a first electrode of the drive transistor being connected to a first power line;
   a first capacitor, a first electrode of the first capacitor being connected to a gate of the drive transistor;
   a second capacitor, a first electrode of the second capacitor being connected to a second electrode of the first capacitor;
   a first transistor, a first electrode of the first transistor being connected to a data line, and a second electrode of the first transistor being connected to a second electrode of the second capacitor; and
   a fifth transistor, a first electrode of the fifth transistor being connected to the second electrode of the first capacitor and a second electrode of the fifth transistor being connected to a stabilized power supply terminal;
   wherein the display panel further comprises:
   a substrate;
   a first conductive layer on one side of the substrate, comprising a first conductive portion configured to form the gate of the drive transistor and the first electrode of the first capacitor;
   a second conductive layer on one side of the first conductive layer away from the substrate, comprising a second conductive portion, wherein an orthographic projection of the second conductive portion on the substrate at least partially overlaps with an orthographic projection of the first conductive portion on the substrate; and the second conductive portion is configured to form the second electrode of the first capacitor and the first electrode of the second capacitor; and
   a third conductive layer on one side of the second conductive layer away from the substrate, comprising a third conductive portion, wherein an orthographic projection of the third conductive portion on the substrate at least partially overlaps with the orthographic projection of the second conductive portion on the substrate, and the orthographic projection of the third conductive portion on the substrate at least partially overlaps with the orthographic projection of the first conductive portion on the substrate; and the third conductive portion is configured to form the second electrode of the second capacitor.

2. The display panel according to claim 1, wherein the orthographic projection of the second conductive portion on the substrate covers an overlapping area of the orthographic projection of the first conductive portion on the substrate and the orthographic projection of the third conductive portion on the substrate.

3. The display panel according to claim 1, further comprising:
a fourth conductive layer on one side of the third conductive layer away from the substrate; and
a fifth conductive layer on one side of the fourth conductive layer away from the substrate, comprising the data line, an orthographic projection of the data line on the substrate extending along a second direction.

4. The display panel according to claim 3, wherein an overlapping area of the orthographic projection of the data line on the substrate and the orthographic projection of the third conductive portion on the substrate is 0.

5. The display panel according to claim 3, comprising a plurality of pixel driving circuits distributed in a first direction, wherein the orthographic projections of the third conductive portions of adjacent pixel driving circuits on the substrate are adjacent and spaced apart along the first direction, the first direction intersecting with the second direction; and
wherein at least part of the orthographic projection of the data line on the substrate is between the orthographic projections of the adjacent third conductive portions on the substrate.

6. The display panel according to claim 5, further comprising:
an active layer between the substrate and the first conductive layer, comprising a ninth active portion connected to the first electrode of the first transistor, the data line being connected to the ninth active portion through at least one via hole;
wherein the first conductive layer further comprises a reset signal line connected to the gate of the first transistor, an orthographic projection of the reset signal line on the substrate extending along the first direction; and
wherein in the first direction, an orthographic projection of the at least one via hole on the substrate is between the orthographic projections of the adjacent third conductive portions on the substrate, and at least part of the orthographic projection of the at least one via hole on the substrate is on one side, away from the orthographic projection of the third conductive portion on the substrate, of the orthographic projection of the reset signal line on the substrate.

7. The display panel according to claim 3, wherein the fourth conductive layer further comprises a plurality of first power lines, orthographic projections of the plurality of first power lines on the substrate extending along the second direction and being spaced part along a first direction, the first direction intersecting with the second direction;
wherein the third conductive layer further comprises a plurality of second power lines, orthographic projections of the plurality of second power lines on the substrate extending along the first direction and being spaced along the second direction; and
wherein at least part of a first power line of the plurality of first power lines is connected to at least part of a second power line of the plurality of second power lines through a via hole.

8. The display panel according to claim 7, wherein the fifth conductive layer further comprises:
a plurality of third power lines, orthographic projections of the plurality of third power lines on the substrate extending along the second direction and being spaced apart along the first direction;
wherein an orthographic projection of a third power line of the plurality of third power lines on the substrate at least partially overlaps with an orthographic projection of the first power line on the substrate, and the third power line is connected to the first power line through a via hole.

9. The display panel according to claim 3, comprising a plurality of pixel driving circuits distributed in a first direction, wherein the fourth conductive layer comprises a plurality of first power lines corresponding to the plurality of pixel driving circuits, and one first power line of the plurality of first power lines is connected to the drive transistor in a corresponding pixel driving circuit of the plurality of pixel driving circuits, the first direction intersecting with the second direction;
orthographic projections of the plurality of first power lines on the substrate extend along the second direction and are spaced apart along the first direction;
the third conductive portion comprises a first edge facing the data line, and an orthographic projection of the first edge on the substrate extends along the second direction, the data line comprising a first extension provided opposite to the first edge in the first direction; and
an orthographic projection on the substrate of one first power line of the plurality of first power lines covers an orthographic projection of the first extension on the substrate, and covers the orthographic projection of the first edge on the substrate.

10. The display panel according to claim 1, comprising a plurality of pixel driving circuits distributed in an array along a first direction and a second direction, the first direction being a row direction and the second direction being a column direction;
wherein the pixel driving circuit further comprises a second transistor, a first electrode of the second transistor being connected to the gate of the drive transistor, a second electrode of the second transistor being connected to the second electrode of the drive transistor; and
wherein
the first conductive layer further comprises a gate drive signal line, an orthographic projection of the gate drive signal line on the substrate extending along the first direction, the gate drive signal line being connected to a gate of the second transistor in a current row of the pixel driving circuits, and a gate of the fifth transistor in a next row of pixel driving circuits.

11. The display panel according to claim 10, further comprising a light emitting unit, wherein the pixel driving circuit is configured to drive the light emitting unit to emit light, and further comprises a sixth transistor, a first electrode of the sixth transistor being connected to a first initial signal line, a second electrode of the sixth transistor being connected to a first electrode of the light emitting unit; and
wherein the gate drive signal line is connected to a gate of the sixth transistor in the current row of pixel driving circuits and the gate of the fifth transistor in the next row of pixel driving circuits.

12. The display panel according to claim 1, wherein the pixel driving circuit further comprises a fourth transistor, a first electrode of the fourth transistor being connected to a first initial signal line and a second electrode of the fourth transistor being connected to the gate of the drive transistor; and wherein
the first conductive layer further comprises a reset signal line, an orthographic projection of the reset signal line on the substrate extending along a first direction, the reset signal line being connected to a gate of the first transistor and a gate of the fourth transistor.

13. The display panel according to claim 12, wherein comprising:
the second conductive layer further comprises a plurality of first initial signal lines, orthographic projections of the plurality of first initial signal lines on the substrate extending along the first direction and being spaced apart along a second direction, the first direction intersecting with the second direction; and
wherein the display panel further comprises: a fifth conductive layer on one side of the second conductive layer away from the substrate, comprising a plurality of second initial signal lines, orthographic projections of the plurality of second initial signal lines on the substrate extending along the first direction and being spaced apart along the second direction;
wherein at least part of a first initial signal line of the plurality of first initial signal lines is connected to at least part of a second initial signal line of the plurality of second initial signal lines through a via hole.

14. The display panel according to claim 1, further comprising:
an active layer between the substrate and the first conductive layer, comprising a tenth active portion configured to form a first channel region of the fifth transistor, an eleventh active portion configured to form a second channel region of the fifth transistor, and a twelfth active portion connected between the tenth active portion and the eleventh active portion;
wherein the orthographic projection of the second conductive portion on the substrate at least partially overlaps with an orthographic projection of the twelfth active portion on the substrate.

15. The display panel according to claim 1, wherein the pixel driving circuit further comprises a fourth transistor, a first electrode of the fourth transistor being connected to a first initial signal line, a second electrode of the fourth transistor being connected to the gate of the drive transistor; and the display panel further comprises:
an active layer between the substrate and the first conductive layer, comprising a thirteenth active portion configured to form a first channel region of the fourth transistor, a fourteenth active portion configured to form a second channel region of the fourth transistor, and a fifteenth active portion connected between the thirteenth active portion and the fourteenth active portion;
wherein the orthographic projection of the second conductive portion on the substrate at least partially overlaps with an orthographic projection of the fifteenth active portion on the substrate.

16. The display panel according to claim 1, comprising a plurality of pixel driving circuits, the plurality of pixel driving circuits comprising a first pixel driving circuit and a second pixel driving circuit distributed adjacent to each other in a first direction;
wherein the first power line in the first pixel driving circuit is connected to the second electrode of the fifth transistor in the second pixel driving circuit.

17. The display panel according to claim 1, further comprises a light emitting unit, wherein the pixel driving circuit is configured to drive the light emitting unit to emit light, and the pixel driving circuit further comprises a seventh transistor and an eighth transistor, a first electrode of the seventh transistor being connected to the first power line, a second electrode of the seventh transistor being connected to the second electrode of the first transistor, a first electrode of the eighth transistor being connected to a second electrode of the drive transistor, a second electrode of the eighth transistor being connected to a first electrode of the light emitting unit; and
wherein
the first conductive layer further comprises an enable signal line, an orthographic projection of the enable signal line on the substrate extending along a first direction, the enable signal line being connected to a gate of the seventh transistor and a gate of the eighth transistor.

18. The display panel according to claim 1, further comprises a light emitting unit, wherein the pixel driving circuit is configured to drive the light emitting unit to emit light, and the pixel driving circuit further comprises a seventh transistor and an eighth transistor, a first electrode of the seventh transistor being connected to a first initial signal line, a second electrode of the seventh transistor being connected to the second electrode of the first transistor, a first electrode of the eighth transistor being connected to a second electrode of the drive transistor, a second electrode of the eighth transistor being connected to a first electrode of the light emitting unit; and
wherein
the first conductive layer further comprises an enable signal line, an orthographic projection of the enable signal line on the substrate extending along a first direction, the enable signal line being connected to a gate of the seventh transistor and a gate of the eighth transistor.

19. A display device, comprising a display panel, wherein the display panel comprises a pixel driving circuit, and the pixel driving circuit comprises:
a drive transistor, a first electrode of the drive transistor being connected to a first power line;
a first capacitor, a first electrode of the first capacitor being connected to a gate of the drive transistor;
a second capacitor, a first electrode of the second capacitor being connected to a second electrode of the first capacitor;
a first transistor, a first electrode of the first transistor being connected to a data line, and a second electrode of the first transistor being connected to a second electrode of the second capacitor; and
a fifth transistor, a first electrode of the fifth transistor being connected to the second electrode of the first capacitor and a second electrode of the fifth transistor being connected to a stabilized power supply terminal;
wherein the display panel further comprises:
a substrate;
a first conductive layer on one side of the substrate, comprising a first conductive portion configured to form the gate of the drive transistor and the first electrode of the first capacitor;
a second conductive layer on one side of the first conductive layer away from the substrate, comprising a second conductive portion, wherein an orthographic projection of the second conductive portion on the substrate at least partially overlaps with an orthographic projection of the first conductive portion on the substrate; and the second conductive portion is configured to form the second electrode of the first capacitor and the first electrode of the second capacitor; and a third conductive layer on one side of the second conductive layer away from the substrate, comprising a third conductive portion, wherein an orthographic projection of the third conductive portion on the substrate at least partially overlaps with the orthographic projection of the second conductive portion on the substrate, and the orthographic projection of the third conductive portion on the substrate at least partially overlaps with the orthographic projection of the first conductive portion on the substrate; and the third conductive portion is configured to form the second electrode of the second capacitor.

* * * * *